United States Patent
Kasai

[11] Patent Number: 5,877,522
[45] Date of Patent: Mar. 2, 1999

[54] DRAM COMPOSED OF OPEN-BIT-LINE TYPE CAPACITOR-OVER-BIT-LINE STRUCTURE MEMORY CELLS

[75] Inventor: Naoaki Kasai, Tokyo, Japan

[73] Assignee: NEC Corporation, Tokyo, Japan

[21] Appl. No.: 903,173

[22] Filed: Jul. 30, 1997

[30] Foreign Application Priority Data

Jul. 30, 1996 [JP] Japan ................................. 8-200635
Dec. 12, 1996 [JP] Japan ................................. 8-331963

[51] Int. Cl.$^6$ ............................................... H01L 29/00
[52] U.S. Cl. .......................... 257/306; 257/68; 257/296; 257/758
[58] Field of Search ............................. 257/68, 296, 306, 257/758

[56] References Cited

U.S. PATENT DOCUMENTS 5,172,202  12/1992  Kazuo ..................................... 257/306

FOREIGN PATENT DOCUMENTS 4279055  10/1992  Japan .

OTHER PUBLICATIONS

T. Ema et al., "3–Dimensional Stacked Capacitor Cel for 16 M and 54 M Drams", pp. 592–595.
M. Sakao et al., A Capacitor–Over–Bit–Line (COG) cell with a Hemispherical–Grain Storage Node for 64Mb DRAMs, pp. IEDM 90–655–IEDM 90–658.

Primary Examiner—Valencia Martin-Wallace
Attorney, Agent, or Firm—Sughrue, Mion, Zinn, Macpeak & Seas, PLLC

[57] ABSTRACT

In an open-bit-line type COB structure DRAM, two adjacent rectangular device formation regions included in two different but adjacent rectangular device formation region arrays, respectively, are staggered in a bit line direction along the long side of each rectangular device formation region by one third (2 F) of a pitch (6 F) of the rectangular device formation region in the bit line direction. Two local interconnections connected through local contact holes to source/drain diffused layers formed in opposite end portions of each rectangular device formation region, are provided in parallel to a word line. Bit lines each connected through a bit contact hole to a source/drain diffused layer formed in a center portion of each rectangular device formation region, are located with a pitch of 2 F. A capacitor formed at a level higher than that of the bit line is connected through a capacitor contact hole to an end positioned above a field oxide film, of a corresponding local interconnection. Thus, the cell size of the open-bit-line type COB structure memory cells can be made to 6 $F^2$.

8 Claims, 41 Drawing Sheets

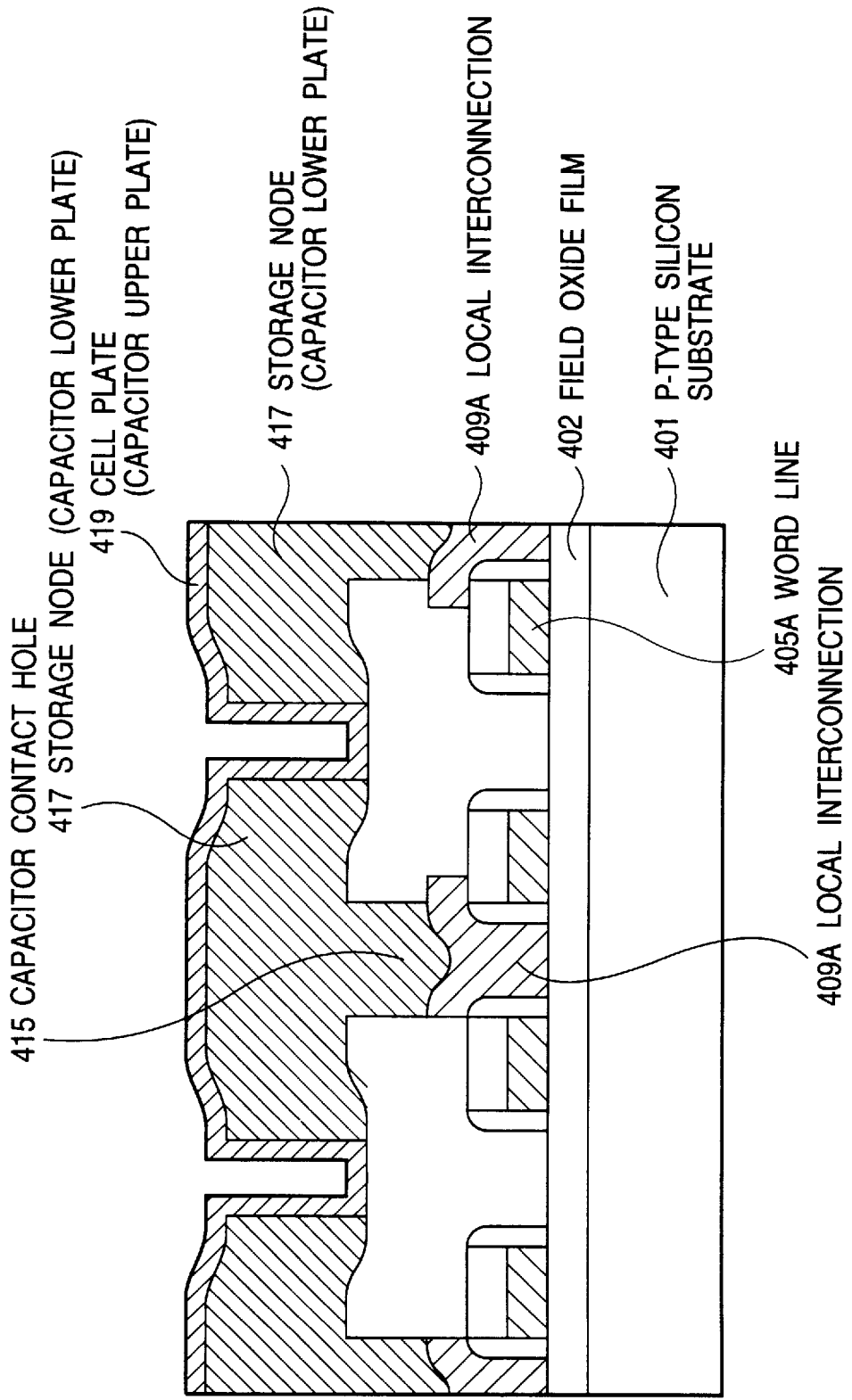

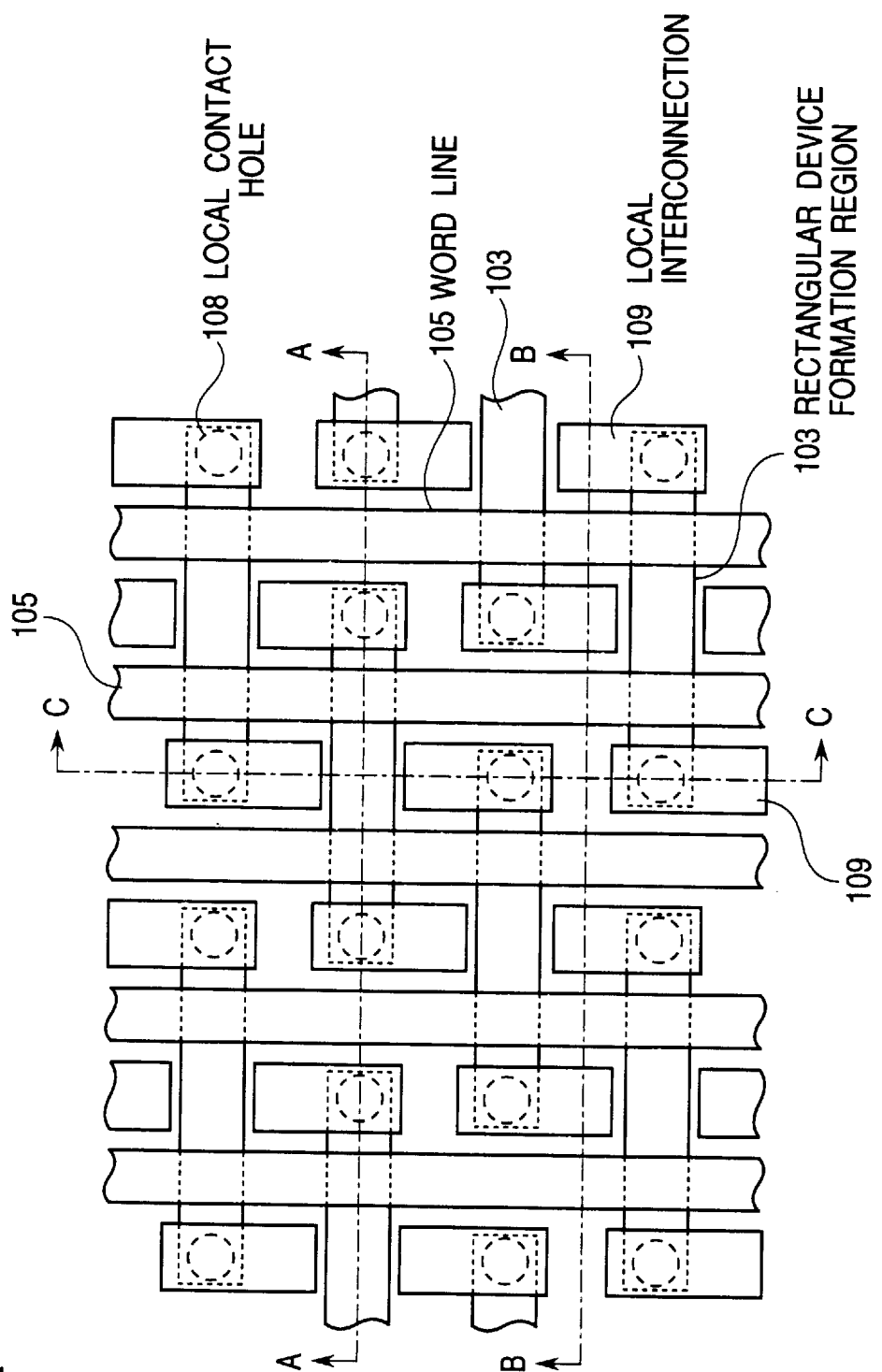

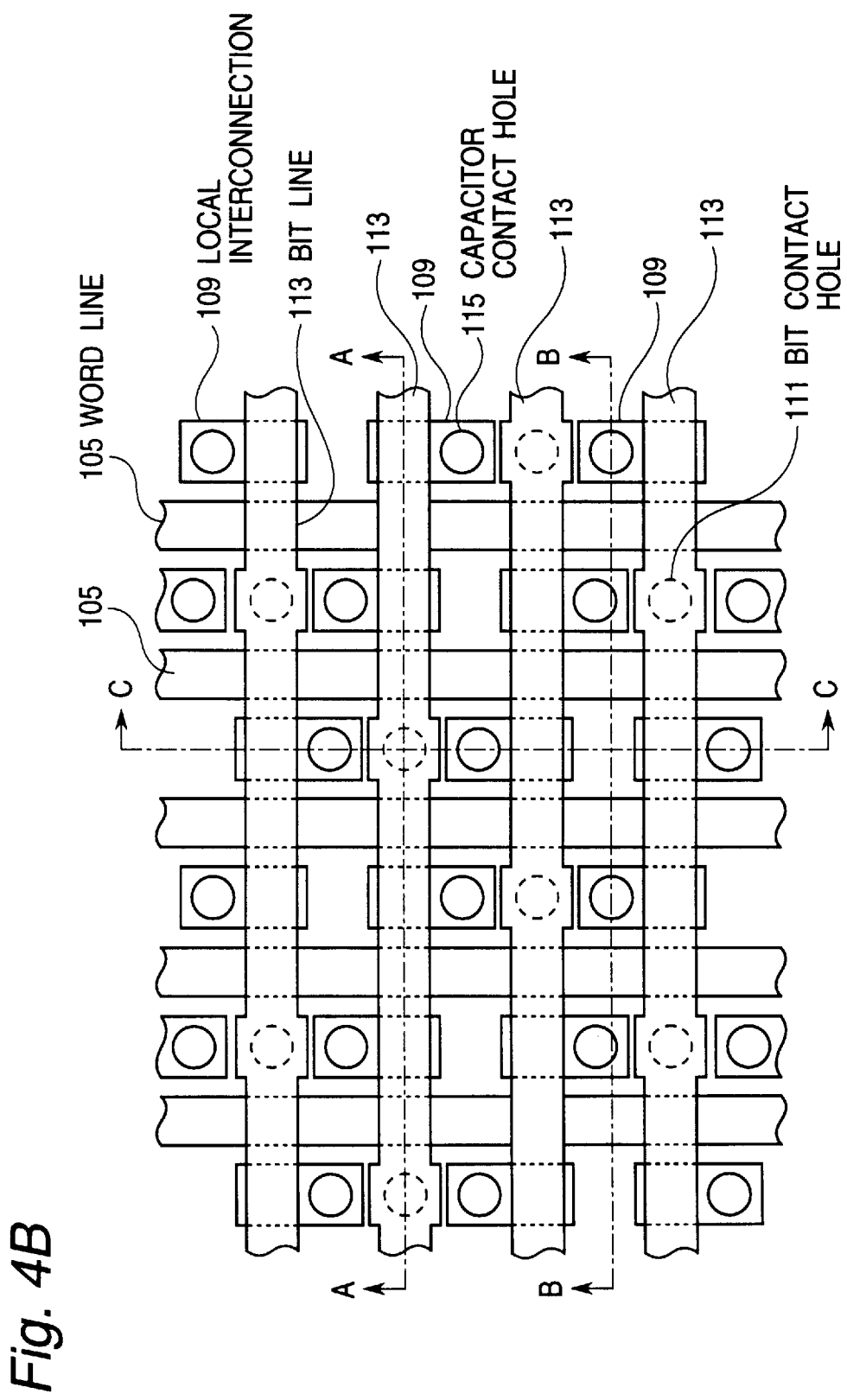

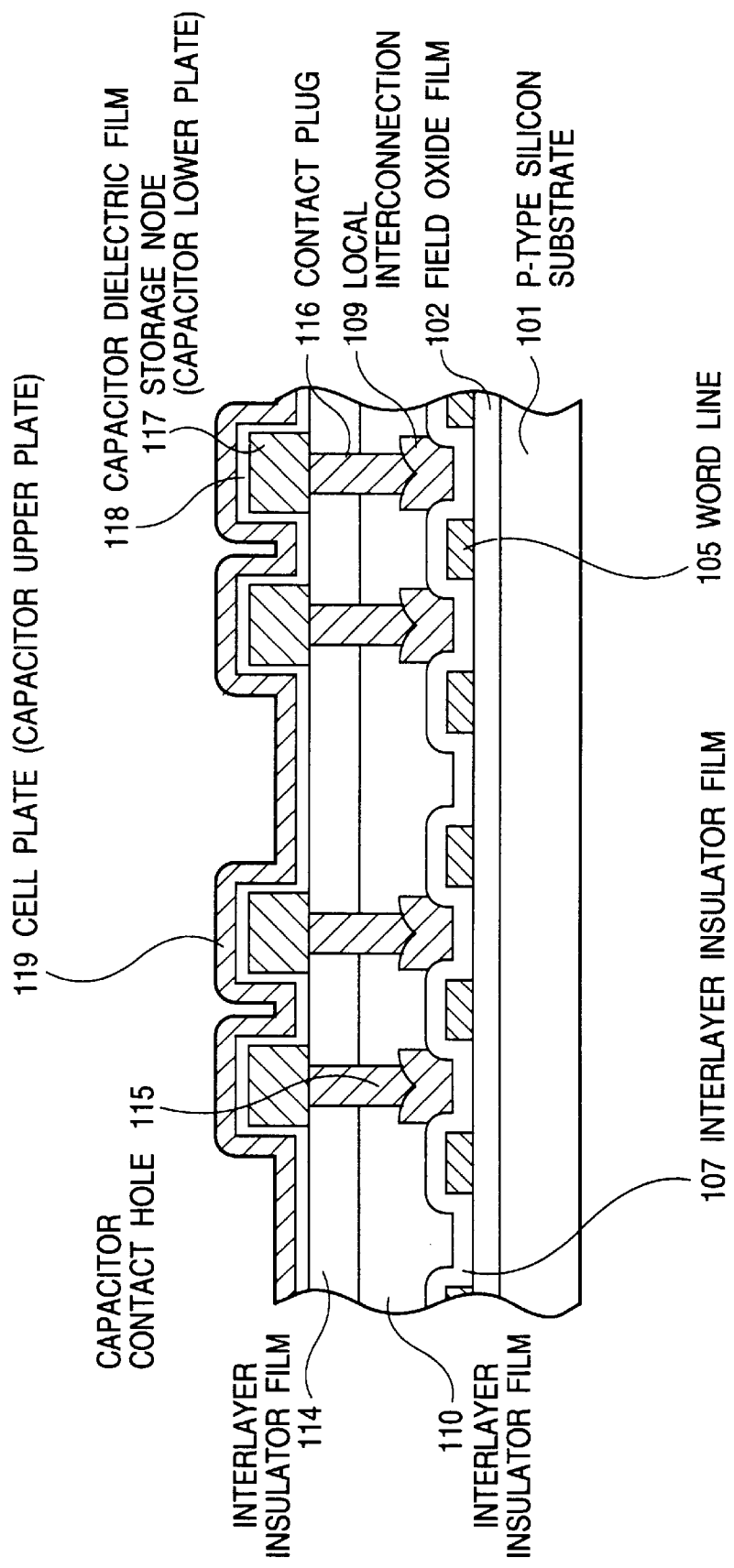

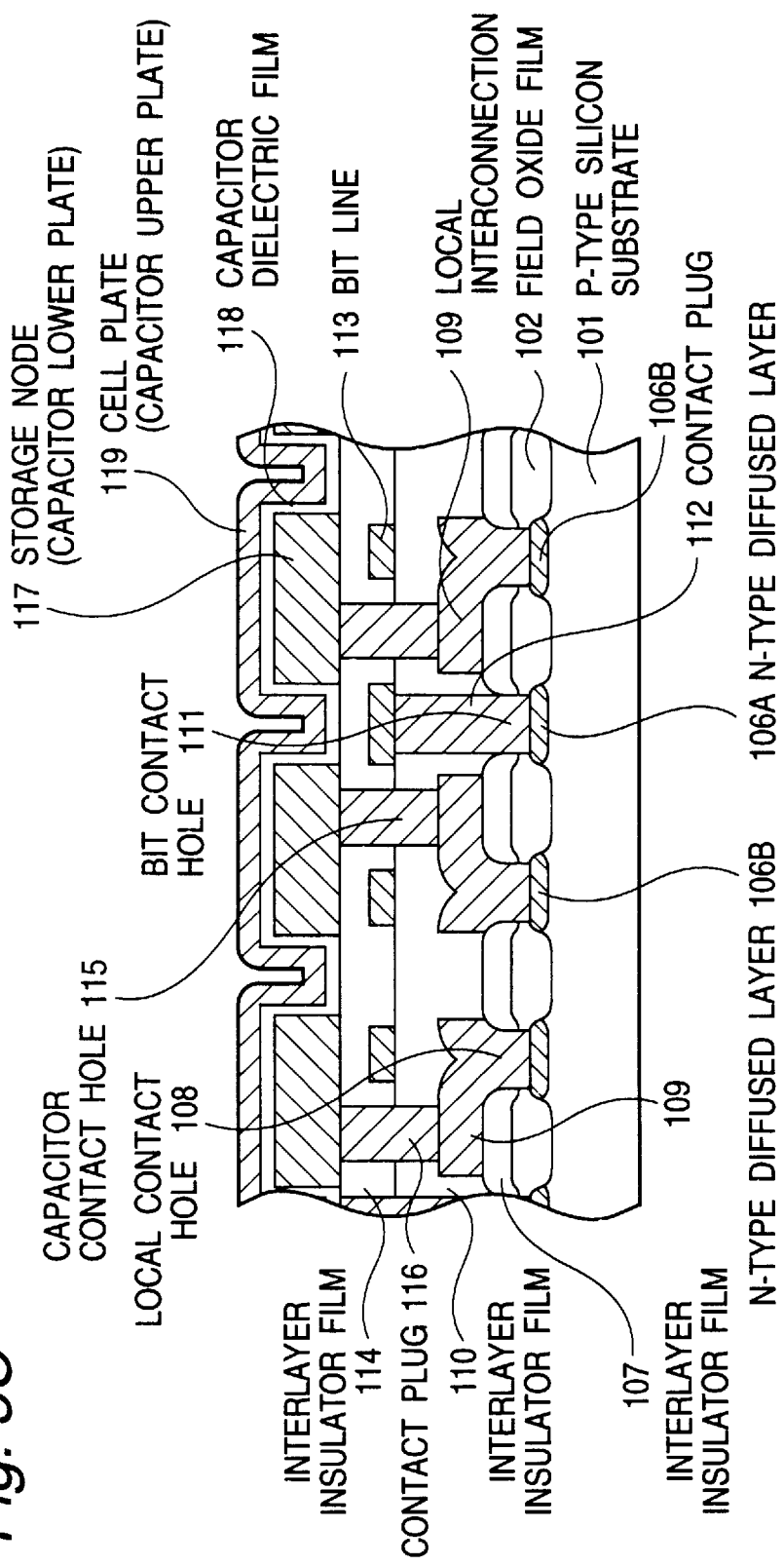

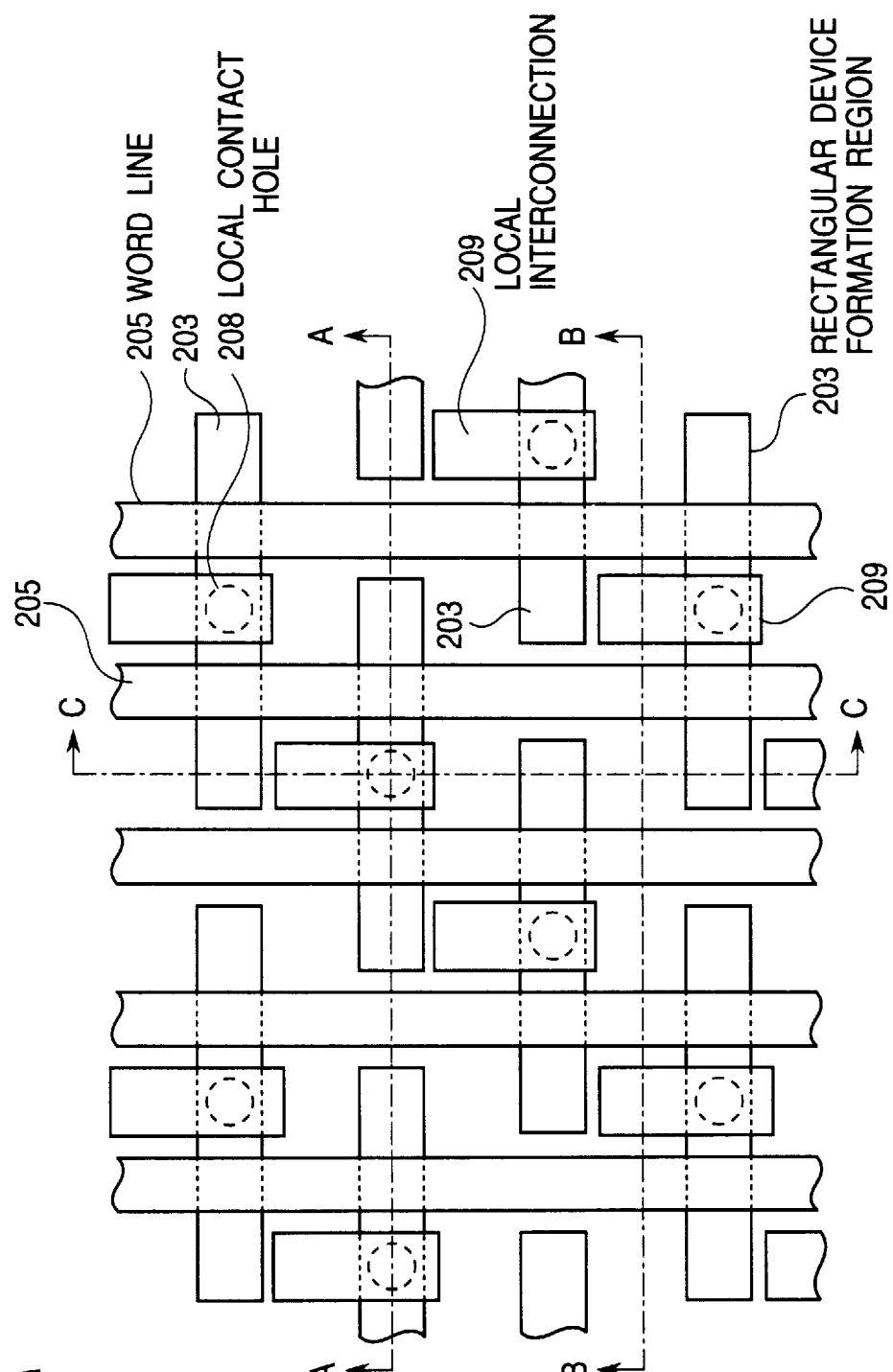

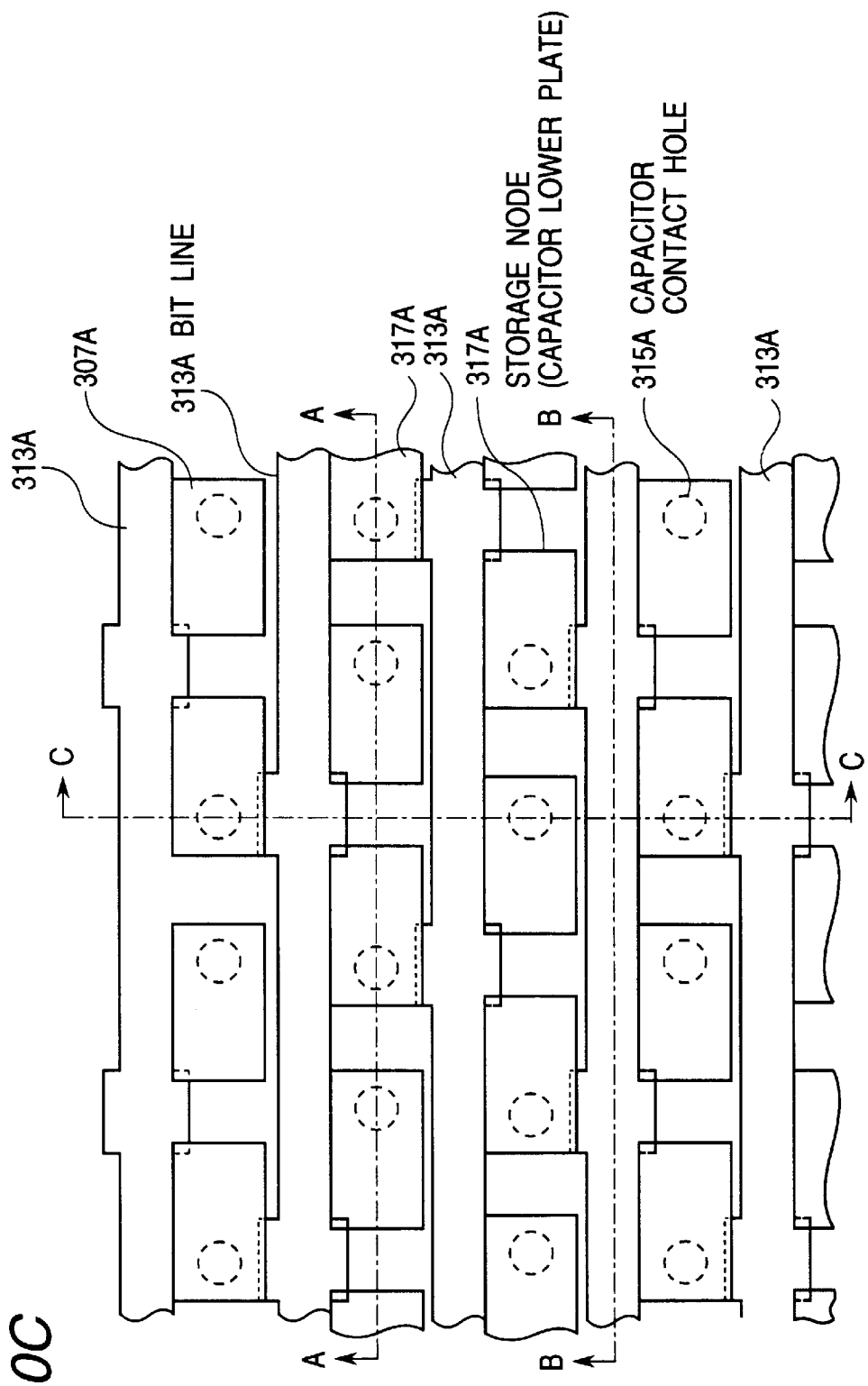

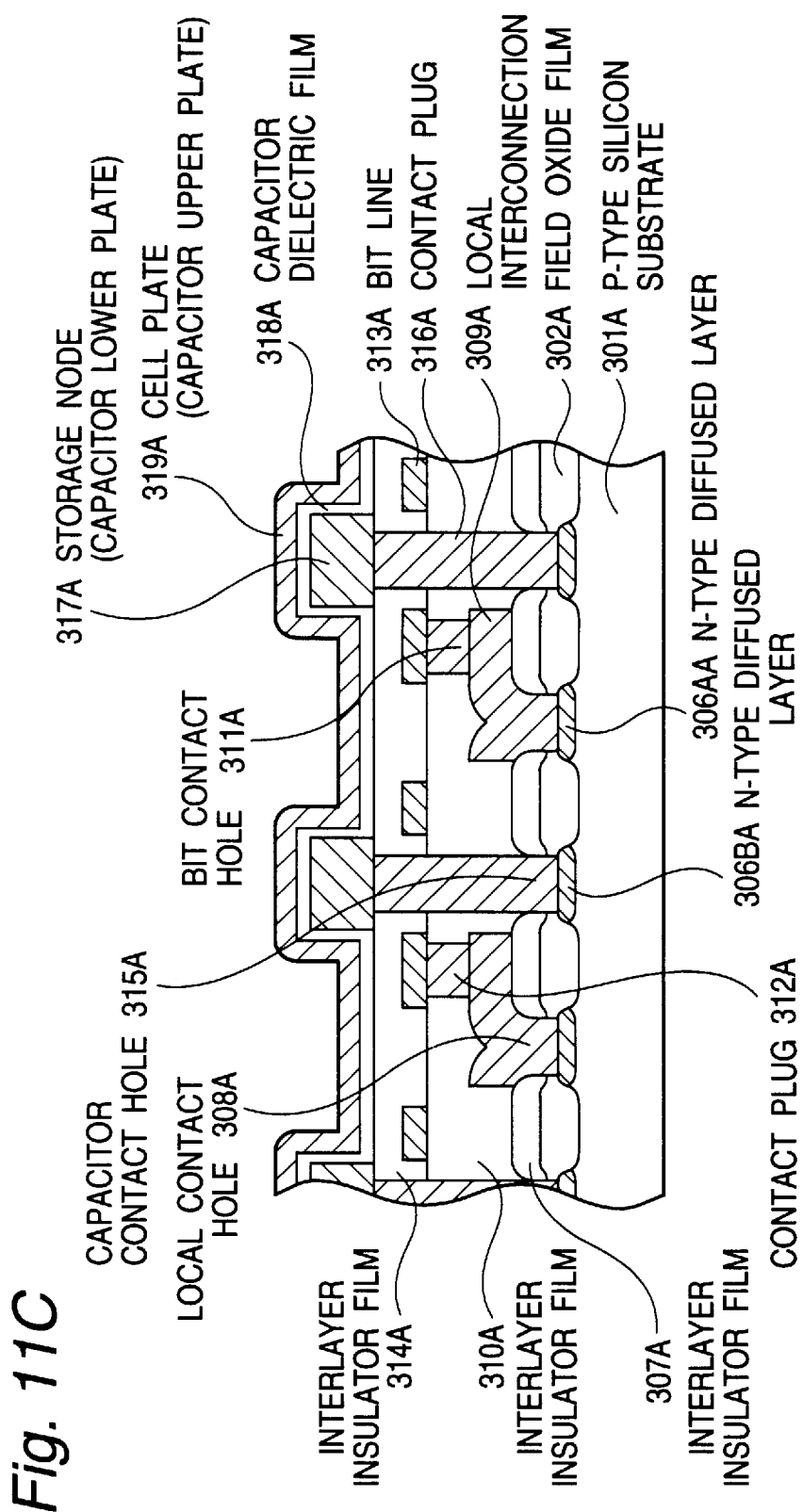

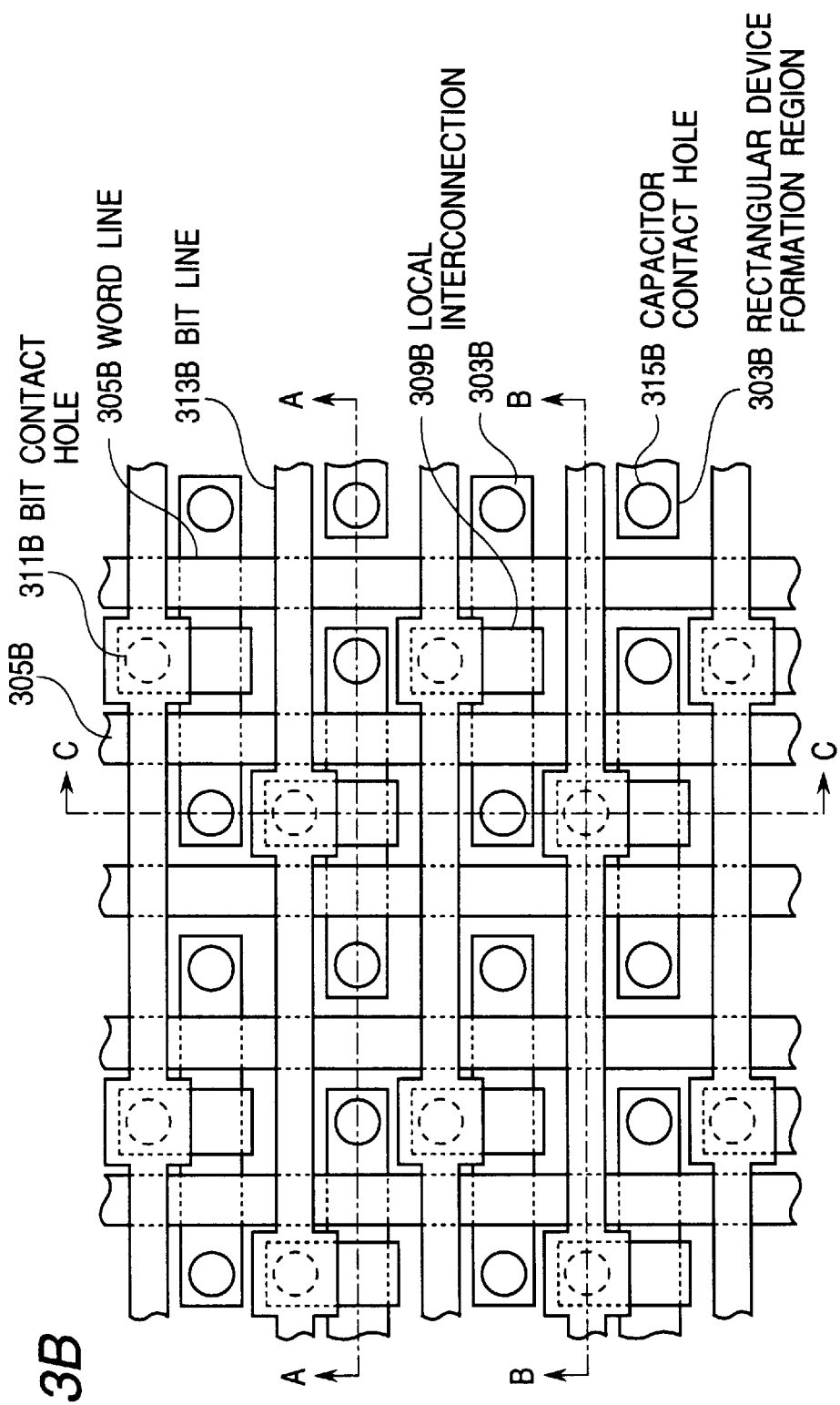

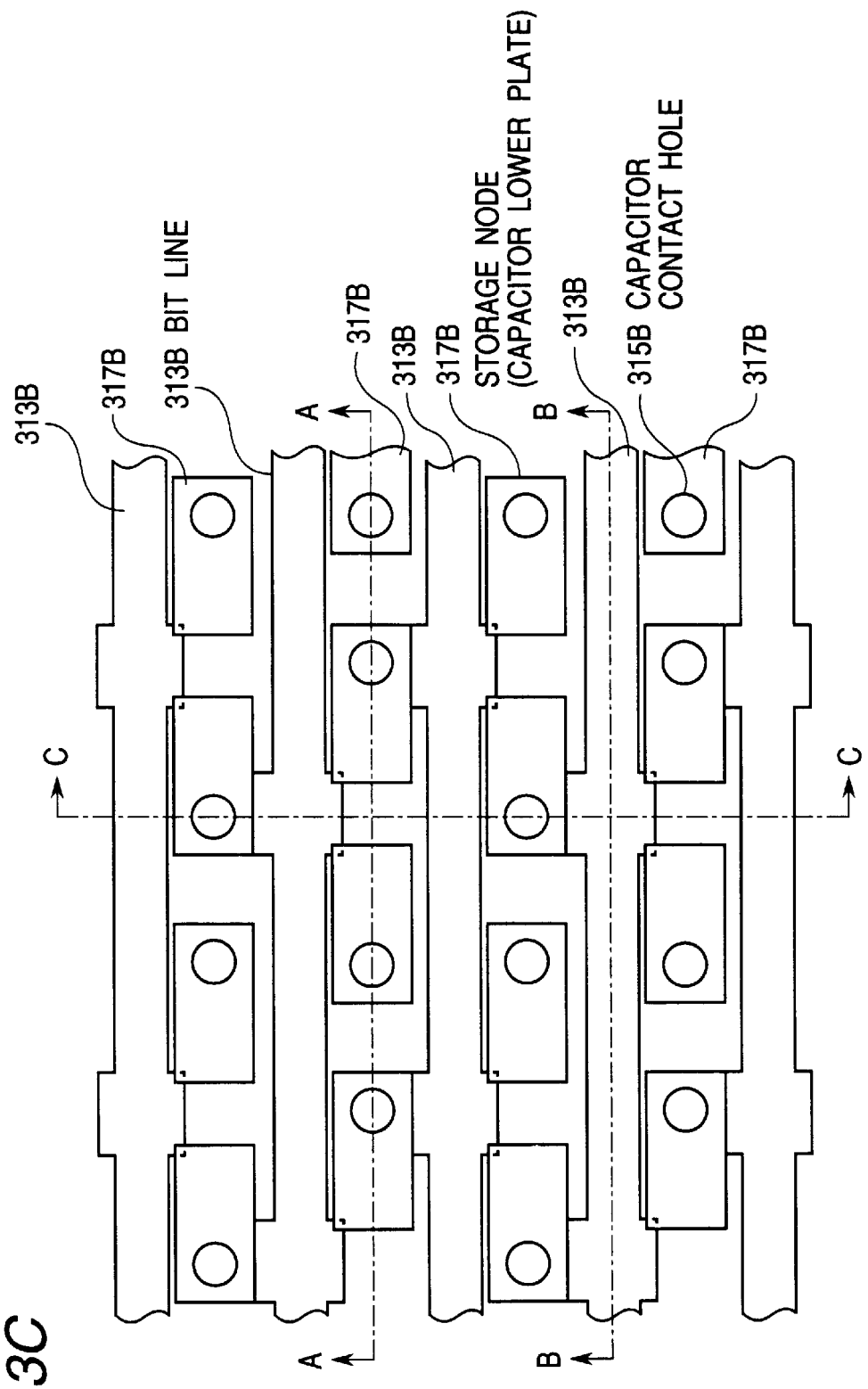

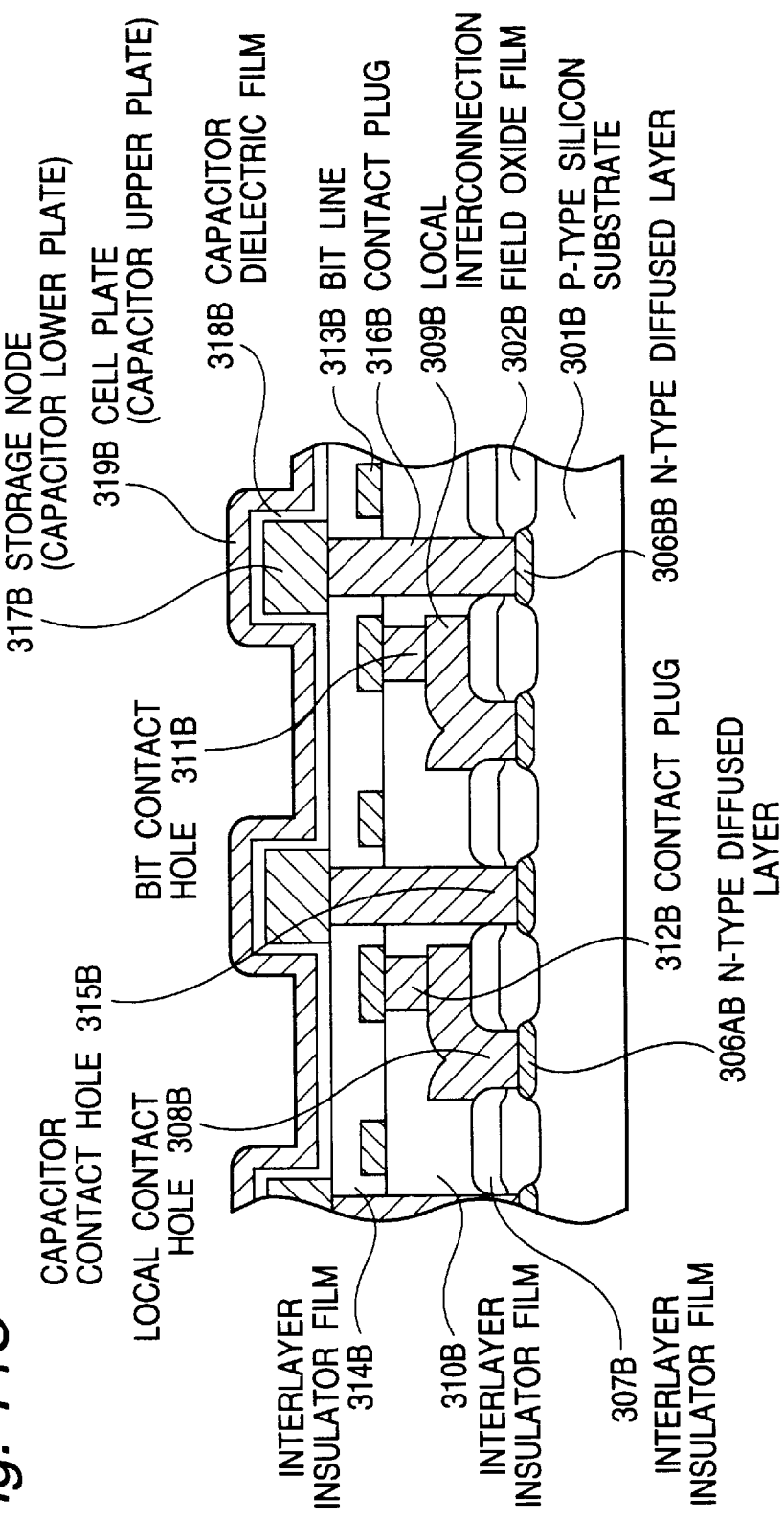

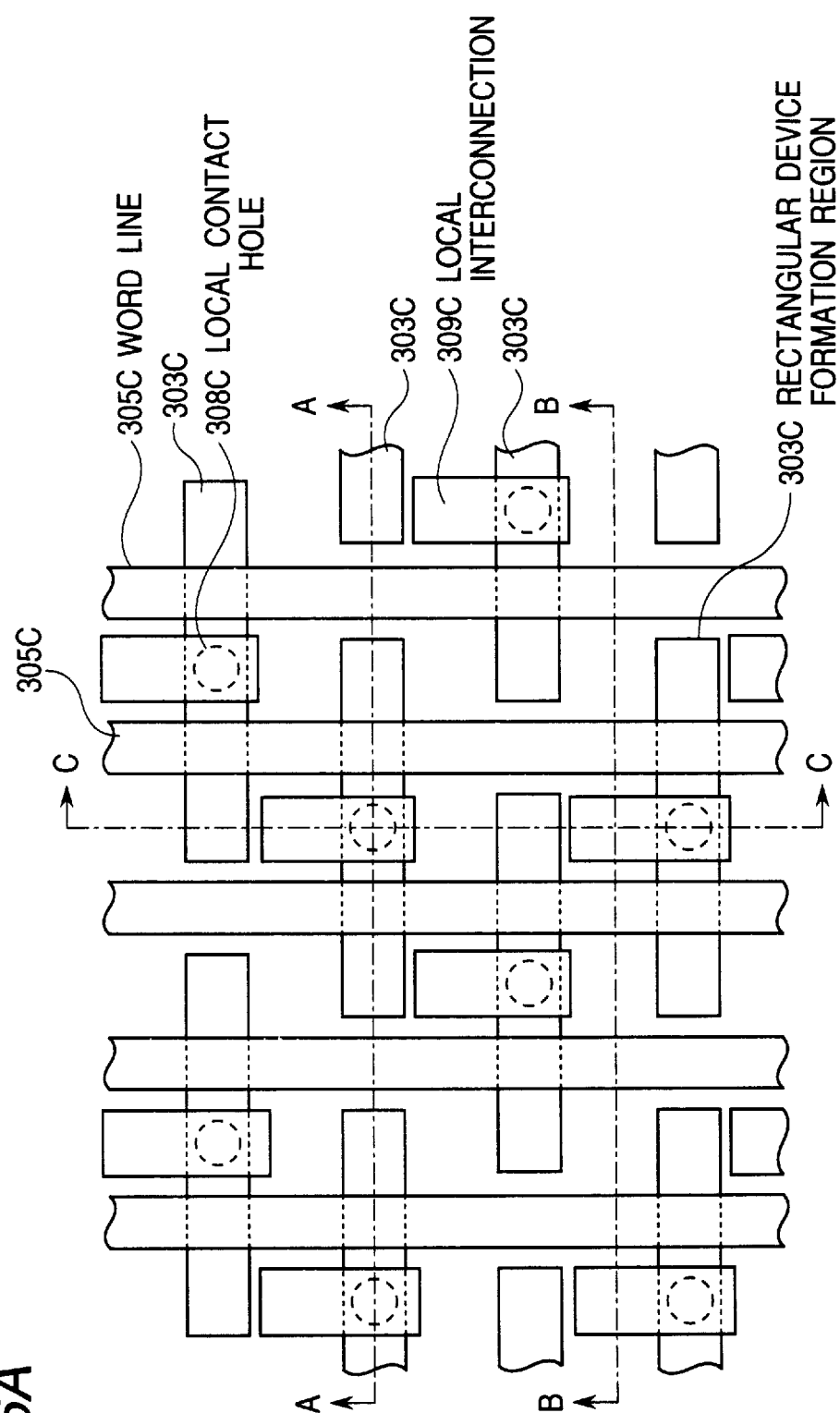

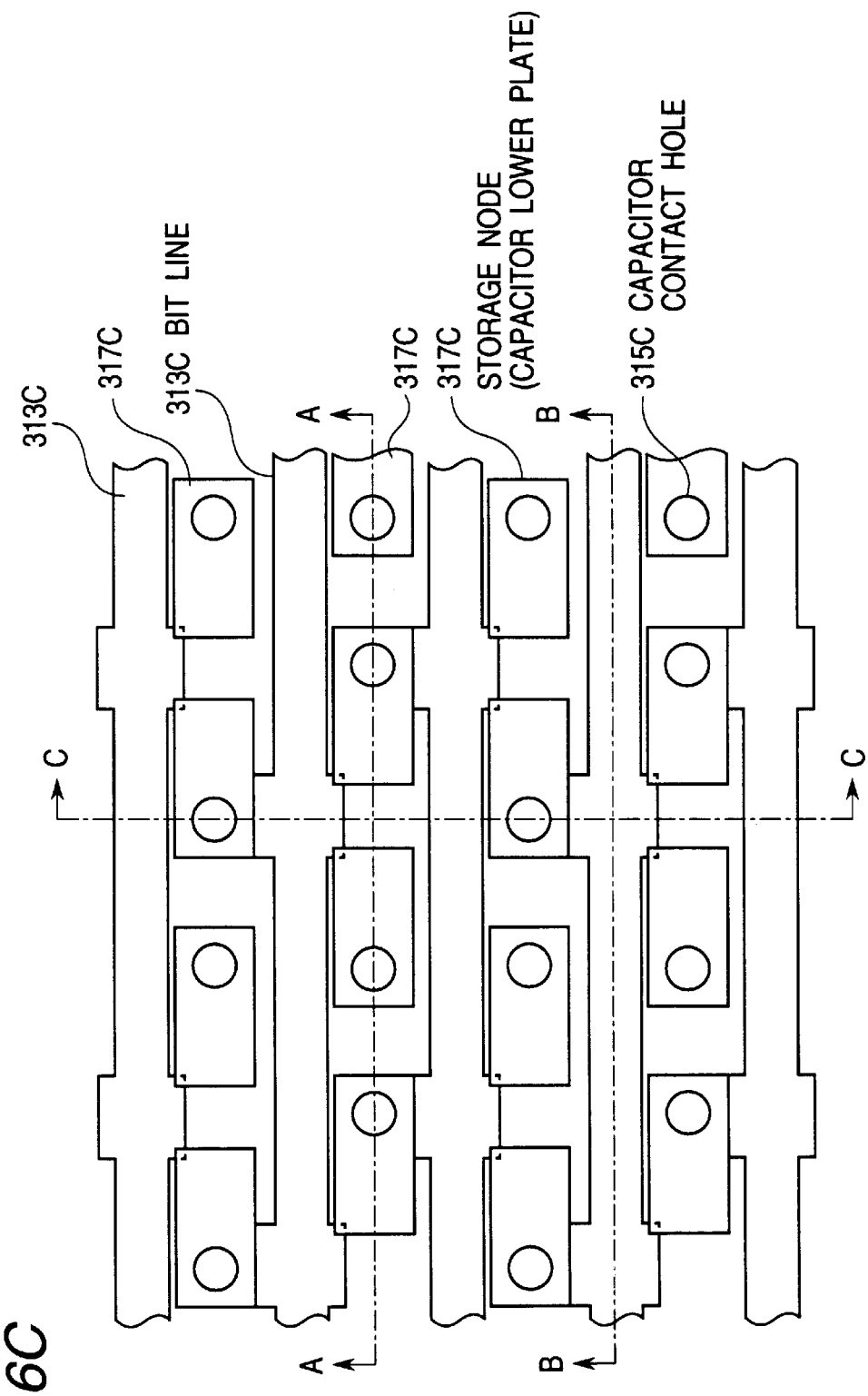

DRAM COMPOSED OF OPEN-BIT-LINE TYPE CAPACITOR-OVER-BIT-LINE STRUCTURE MEMORY CELLS

BACKGROUND OF THE INVENTION

1. Field of the Invention

The present invention relates to a semiconductor memory, and more specifically to a DRAM (dynamic random access memory) composed of open-bit-line type capacitor-over-bit-line (COB) structure memory cells.

2. Description of Related Art

A DRAM composed of one-transistor one-capacitor memory cells has increased its storage capacity by four times every three years (alternation of generations) due to advancement in micro-fabrication technology, device technology and circuit technology. In addition, the memory cell size has been reduced to about 40% of the memory cell of the preceding generation. With the reduction of the memory cell size, it is necessary to correspondingly reduce the size of various elements constituting the memory cell, and actually, the transistor has been reduced in size in accordance with a so called scaling rule. However, in order to ensure a satisfactory S/N ratio and a higher immunity to soft error, the capacitor of each DRAM memory cell is required to have a storage capacitance of not smaller than a certain constant value. Therefore, it is not allowed to reduce the storage capacitance in proportion with the reduction of the memory cell area in a plan view. This is a large problem.

In order to obtain a large storage capacitance even if the capacitor area is reduced in a plan view projected on a principal surface of a semiconductor substrate, a stacked capacitor has been already reduced in practice, in which a storage node electrode constituting a lower plate of the capacitor is constructed in a three-dimensional structure, namely, to have a substantial height, and a side surface of the storage node electrode is effectively utilized. The initially proposed memory cell using the stacked capacitor was so constructed that the capacitor is formed above the transistor and a bit line is formed over the capacitor.

However, this structure has the following two problems: First, if the height of the storage node is elevated to increase a side surface area for the purpose of increasing the storage capacitance, the depth of a contact hole for interconnecting between a bit line and one of a pair of source/drain diffused regions of the associated transistor (bit contact hole) becomes large, with the result that it becomes difficult to form the contact hole. In addition, since a step difference in an insulator film covering the capacitor becomes large, it also becomes difficult to form the bit line. Secondly, the area of the capacitor projected in the plan view, used within the memory cell area, inevitably becomes small by the area of the bit line contact.

In order to overcome the above mentioned problems, T. Ema et al, "3-Dimensional Stacked Capacitor Cell For 16M and 64M DRAMs", 1988 International Electron Devices Meeting Technical Digest, pages 592–595, reported the so called COB structure memory cell in which the capacitor is formed over the bit line. In this report, a T-shaped device formation region is confined on a surface of the semiconductor substrate, and a bit line is connected through a bit contact hole to one of a pair of source/drain diffused regions, formed in a center bar portion of the T-shaped device formation region, and over the bit line there is formed a capacitor which is connected through a capacitor contact hole to the other of the pair of source/drain diffused regions, positioned at one of opposite ends of the T-shaped device formation region. The memory cell of the structure proposed in this report is disadvantageous in that a junction capacitance in the one source/drain diffused region connected to the bit line becomes large, so that a parasite capacitance of the bit line correspondingly becomes large.

Japanese Patent Application Pre-examination Publication No. JP-A-03-072673 and its corresponding U.S. Pat. No. 5,172,202, (the content of which is incorporated by reference in its entirety into this application) proposed to reduce the parasite capacitance of the bit line by providing a local interconnection.

Now, the first prior art semiconductor memory disclosed by JP-A-03-072673 and U.S. Pat. No. 5,172,202, will be described with reference to FIGS. 1A, 1B and 1C and FIGS. 2A and 2B. FIGS. 1A, 1B and 1C are layout diagrams at different levels, and FIG. 1A illustrates a positional relation between a device formation region, a word line and a local interconnection. FIG. 1B illustrates a positional relation between the local interconnection and a bit line, and FIG. 1C illustrates a positional relation between the bit line and a capacitor storage node (capacitor lower plate). FIG. 2A is a sectional view taken along the line A—A in FIGS. 1A, 1B and 1C, and FIG. 2B is a sectional view taken along the line B—B in FIGS. 1A, 1B and 1C.

A field oxide film 402 is formed in a device isolation region on a principal surface of a P-type silicon substrate 401, so that a number of rectangular device formation regions 403A confined by the field oxide film 402 are formed on the principal surface of the P-type silicon substrate 401. The rectangular device formation regions 403A are arranged to form a plurality of rectangular device formation region arrays extending along a long side of each rectangular device formation region 403A, and two adjacent rectangular device formation regions included in two different but adjacent rectangular device formation region arrays, respectively, are staggered by one half of a pitch of the rectangular device formation region in a direction along the long side of each rectangular device formation region 403A. In each rectangular device formation region 403A, two transistors are formed.

In each rectangular device formation region 403A, a gate oxide film 404 is formed on the principal surface of the P-type silicon substrate 401, and two word lines 405A each acting as a gate electrode are formed on the gate oxide film 404. Each word line 405A extends generally orthgonally to the long side of each rectangular device formation region 403A, while depicting a slight zigzag line. In addition, in each rectangular device formation region 403A, one N-type diffused layer 406A and two N-type diffused layers 406B are formed in self alignment with the word lines 405A and the field oxide film 402.

A local interconnection 409A connected through a local contact hole 408A to a corresponding N-type diffused layer 406B, extends to pass over the word line 405A adjacent to the rectangular device formation region 403A, and then to reach the field oxide film 402. Two local interconnections 409A connected to the two N-type diffused layers 406B, respectively, formed in each one rectangular device formation region 403A, extend in an opposite direction to each other, at a desired angle to the long side of each rectangular device formation region 403A.

A bit line 413A connected to the N-type diffused layer 406A through a bit contact hole 411A (which is filed with a contact plug 412), is formed at a level higher than those of the word lines 405A and the local interconnection 409A, and is located to extend along the rectangular device formation region array 403A. Furthermore, a capacitor storage node 417 (constituting a capacitor lower plate) connected to a corresponding local interconnection 409A through a capacitor contact hole 415 which is positioned for example above the field oxide film 402 and which reaches one end of the corresponding local interconnection 409A, is formed at a level higher than those of the word lines 405A and the bit lines 413A. A surface of the capacitor storage node 417 is coated with a capacitor dielectric film (not shown) and further covered with a cell plate 419 (constituting a capacitor upper plate).

Another prior art memory cell using the local interconnection was disclosed by Japanese Patent Application Pre-examination Publication No. JP-A-04-279055 (an English abstract of which is available from the Japanese Patent Office, and the content of the English abstract of JP-A-04-279055 is incorporated by reference in its entirety into this application). This second prior art memory cell will be described with reference to FIG. 3, which is a plan view illustrating a layout pattern of the second prior art memory cell, with the bit line being partially removed out for showing a layout structure under the bit line.

Rectangular device formation regions 403B confined on a principal surface of a semiconductor device are arranged to form a plurality of rectangular device formation region arrays extending along a long side of each rectangular device formation region 403B, and two adjacent rectangular device formation regions included in two different but adjacent rectangular device formation region arrays, respectively, are staggered by one half of a pitch of the rectangular device formation region in a direction along the long side of each rectangular device formation region 403A. In each rectangular device formation region 403A, two transistors are formed. On a gate oxide film formed inn each rectangular device formation region 403A, two word lines 405B each acting as a gate electrode are formed, each of which extends generally orthgonally to the long side of each rectangular device formation region 403B.

Differently from the local interconnection in the first prior art memory cell disclosed in JP-A-03-072673 and U.S. Pat. No. 5,172,202, a local interconnection 409B of this second prior art memory cell is connected through a local contact hole 408B to a diffused layer formed in the rectangular device formation region 403B between the two word lines 405B. The local interconnection 409B extends over the device formation region 403B, in parallel to the word line 405B. A bit line 413B connected through a bit contact hole 411B to a portion of the local interconnection 409B extending over a device isolation region which confines the rectangular device formation regions 403B, is formed in parallel to the device formation region arrays. Opposite end portions 424 of each rectangular device formation region 403B, which do not overlap the bit line 413B, are connected to corresponding capacitors (not shown), respectively.

Here, the cell size of the DRAM memory cell is expressed by F (Feature-size) which is defined as being one half of the pitch of the word line. On the other hand, the DRAM memory cell disclosed in JP-A-03-072673 and U.S. Pat. No. 5,172,202, is of a turned-back bit line type, and the DRAM memory cell disclosed in JP-A-04-279055 is of an open-bit-line type. In the prior art DRAM memory cell disclosed in JP-A-03-072673 and U.S. Pat. No. 5,172,202, by adopting the rectangular device formation regions and the local interconnections, the pitch of the rectangular device formation regions is 8 F in a bit line direction (along the long side of the rectangular device formation regions) and 2 F in a word line direction. Therefore, the cell size of the memory cell of the turned-back bit line type the DRAM memory cell disclosed in JP-A-03-072673 and U.S. Pat. No. 5,172,202 can be reduced to 8 $F^2$ which is a target value in this type memory cell. However, this value is larger, by 2 $F^2$, than 6 $F^2$ which is a target value in the open-bit-line type DRAM memory cell as disclosed in JP-A-04-279055.

The open-bit-line type memory cell is advantageous over the turned-back bit line type memory cell in that the cell size can be reduced in comparison with the turned-back bit line type memory cell. In the open-bit-line type memory cell, the pitch of device formation regions (in each of which two memory cells are formed) is 6 F in the bit line direction. Therefore, if the pitch of the memory cells in the word line direction can be made to 2 F, the memory cell size can be made to 6 $F^2$. In a cell array composed of conventional open-bit-line type memory cells having the device formation regions located with the bit line direction pitch of 6 F, no stagger exists between two adjacent device formation regions which are included in different but adjacent device formation region arrays, and therefore, the spacing between two word lines passing over two adjacent device formation regions included in the same device formation region array, becomes 3 F, and an empty device formation region exists between these word lines and in parallel to these word lines.

Because of this reason, even if the rectangular device formation regions and the local interconnections as disclosed in JP-A-03-072673 and U.S. Pat. No. 5,172,202 or JP-A-04-279055 are adopted, since it is necessary to take into consideration a spacing (=F) between local interconnections, the pitch of the memory cell in the word line direction becomes 3 F (not 2 F) similarly to the open-bit-line type memory cell having the T-shaped device formation region, with the result that the cell size of the memory cell becomes 9 $F^2$ which is greatly larger than 6 $F^2$ which the target value in the open-bit-line type memory cell. Because of the above mentioned circumstance, the DRAM composed of the open-bit-line type memory cells has not adopted the means proposed by JP-A-03-072673 and U.S. Pat. No. 5,172,202 or JP-A-04-279055, and various efforts and studies are being made to approach the word line direction pitch of the memory cells to 2 F. However, this has not yet been realized.

SUMMARY OF THE INVENTION

Accordingly, it is an object of the present invention to provide a DRAM composed of the open-bit-line type COB structure memory cells, which has overcome the above mentioned defect of the conventional one.

Another object of the present invention is to provide a DRAM composed of the open-bit-line type COB structure memory cells, capable of realizing the cell size of 6 $F^2$ by making the bit line direction pitch and the word line direction pitch of the device formation region in which two memory cells are formed, to 6 F and 2 F, respectively.

The above and other objects of the present invention are achieved in accordance with the present invention by a semiconductor memory of the type including a number of memory cells each of which is composed of a transistor formed at a principal surface of a semiconductor substrate, a bit line formed at a level higher than that of the transistor, and a capacitor composed of a capacitor lower electrode, a capacitor dielectric film and a capacitor upper electrode which are formed at a level higher than that of the bit line; the semiconductor memory comprising:

a plurality of rectangular device formation regions confined in the principal surface of the semiconductor substrate by a device isolation film formed on the principal surface of the semiconductor substrate, separated from each other with a predetermined spacing, the rectangular device formation regions being located to form a plurality of rectangular device formation region arrays along a long side of the rectangular device formation regions, two adjacent rectangular device formation regions included in two different adjacent rectangular device formation region arrays, respectively, being staggered in a bit line direction along the long side of each rectangular device formation region by one third of a pitch of the rectangular device formation regions in the bit line direction;

two transistors formed in each of the rectangular device formation regions, the two transistors including two word lines formed on a gate oxide film formed on the principal surface of the semiconductor substrate within the rectangular device formation region, to extend orthogonally to the long side of each rectangular device formation region, a first diffused layer formed in a surface region of the semiconductor substrate between the two word lines within the rectangular device formation region, and two second diffused layers formed in the surface region of the semiconductor substrate between the device isolation film and the two word lines within the rectangular device formation region, so that each of the two transistors is formed of one of the two word lines, the first diffused layer, and one adjacent to the one of the two word lines, of the two second diffused layers;

a plurality of bit lines formed at a level higher than that of the word lines, insulated from the word lines, each of the bit lines extending in a direction orthogonal to the word lines, along a corresponding rectangular device formation region array, and being connected through a bit contact hole to the first diffused layer of the rectangular device formation regions included in the corresponding rectangular device formation region array;

two local interconnections provided for each one of the rectangular device formation regions, the local interconnections being connected through local contact holes to the second diffused layers formed in the rectangular device formation region, respectively, the local interconnections extending in parallel to the word lines and in an opposite direction to each other, to reach a position above the device isolation film; and a capacitor lower electrode formed at a level higher than that of the bit lines, insulated from the bit lines, for each one of the transistors, the capacitor lower being connected through a capacitor contact hole formed between adjacent bit lines, to one end positioned above the device isolation film, of a corresponding local interconnection, the capacitor lower electrode being covered with a capacitor dielectric film which is also covered with a capacitor upper electrode, so that one storage capacitor is constituted of the capacitor lower electrode, the capacitor dielectric film and the capacitor upper electrode.

Preferably, the capacitor lower electrode is rectangular in a plan view shape projected onto the principal surface of the semiconductor substrate, and a long side of the rectangular plan view shape is in parallel to the word lines or in parallel to the bit lines.

According to another aspect of the present invention, there is provided a semiconductor memory of the type including a number of memory cells each of which is composed of a transistor formed at a principal surface of a semiconductor substrate, a bit line formed at a level higher than that of the transistor, and a capacitor composed of a capacitor lower electrode, a capacitor dielectric film and a capacitor upper electrode which are formed at a level higher than that of the bit line; the semiconductor memory comprising:

a plurality of rectangular device formation regions confined in the principal surface of the semiconductor substrate by a device isolation film formed on the principal surface of the semiconductor substrate, separated from each other with a predetermined spacing, the rectangular device formation regions being located to form a plurality of rectangular device formation region arrays along a long side of the rectangular device formation regions, two adjacent rectangular device formation regions included in two different adjacent rectangular device formation region arrays, respectively, being staggered in a bit line direction along the long side of each rectangular device formation region by one third of a pitch of the rectangular device formation regions in the bit line direction;

two transistors formed in each of the rectangular device formation regions, the two transistors including two word lines formed on a gate oxide film formed on the principal surface of the semiconductor substrate within the rectangular device formation region, to extend orthogonally to the long side of each rectangular device formation region, a first diffused layer formed in a surface region of the semiconductor substrate between the two word lines within the rectangular device formation region, and two second diffused layers formed in the surface region of the semiconductor substrate between the device isolation film and the two word lines within the rectangular device formation region, so that each of the two transistors is formed of one of the two word lines, the first diffused layer and one of the second diffused layers adjacent to the one of the two word lines;

a local interconnection provided for each one of the rectangular device formation regions, the local interconnection being connected through local contact holes to the first diffused layer formed in the rectangular device formation region, and the local interconnection extending in a predetermined direction in parallel to the word lines to reach a position above the device isolation film; and a plurality of bit lines formed at a level higher than that of the word lines, insulated from the word lines, each of the bit lines extending in a direction orthogonal to the word lines, in parallel to and between adjacent rectangular device formation region arrays, and each of the bit lines being connected through a bit contact hole to an end positioned above the device isolation film, of the local interconnection; and a capacitor lower electrode formed at a level higher than that of the bit lines, insulated from the bit lines, for each one of the transistors, the capacitor lower being connected through a capacitor contact hole to a corresponding one of the two second diffused regions, the capacitor lower electrode being covered with a capacitor dielectric film which is also covered with a capacitor upper electrode, so that one storage capacitor is constituted of the capacitor lower electrode, the capacitor dielectric film and the capacitor upper electrode.

Preferably, the two adjacent rectangular device formation regions included in the two different adjacent rectangular device formation region arrays, respectively, are staggered, either in order or alternately, in the bit line direction along the long side of each rectangular device formation region by one third of the pitch of the rectangular device formation region in the bit line direction. Furthermore, preferably, the capacitor lower electrode is rectangular in a plan view shape projected onto the principal surface of the semiconductor substrate, and a long side of the rectangular plan view shape is in parallel to the word lines or in parallel to the bit lines.

The above and other objects, features and advantages of the present invention will be apparent from the following description of preferred embodiments of the invention with reference to the accompanying drawings.

BRIEF DESCRIPTION OF THE DRAWINGS

FIGS. 2A and 2B are sectional views taken along the line A—A and along the line B—B in FIGS. 1A, 1B and 1C, respectively;

FIGS. 4A, 4B and 4C are layout diagrams at different levels, for illustrating the positional relations between various constituents of a first embodiment of the DRAM in accordance with the present invention;

FIGS. 5A, 5B and 5C are sectional views taken along the line A—A, along the line B—B, and along the line C—C in FIGS. 4A, 4B and 4C, respectively;

FIGS. 7A, 7B and 7C are layout diagrams at different levels, for illustrating the positional relations between various constituents of a second embodiment of the DRAM in accordance with the present invention;

FIGS. 10A, 10B and 10C are layout diagrams at different levels, for illustrating the positional relations between various constituents of a third embodiment of the DRAM in accordance with the present invention;

FIGS. 11A, 11B and 11C are sectional views taken along the line A—A, along the line B—B, and along the line C—C in FIGS. 10A, 10B and 10C, respectively;

FIGS. 13A, 13B and 13C are layout diagrams at different levels, for illustrating the positional relations between various constituents of a fourth embodiment of the DRAM in accordance with the present invention;

FIGS. 14A, 14B and 14C are sectional views taken along the line A—A, along the line B—B, and along the line C—C in FIGS. 13A, 13B and 13C, respectively;

FIGS. 16A, 16B and 16C are layout diagrams at different levels, for illustrating the positional relations between various constituents of a fifth embodiment of the DRAM in accordance with the-present invention;

DESCRIPTION OF THE PREFERRED EMBODIMENTS

First Embodiment

Figure 1A:
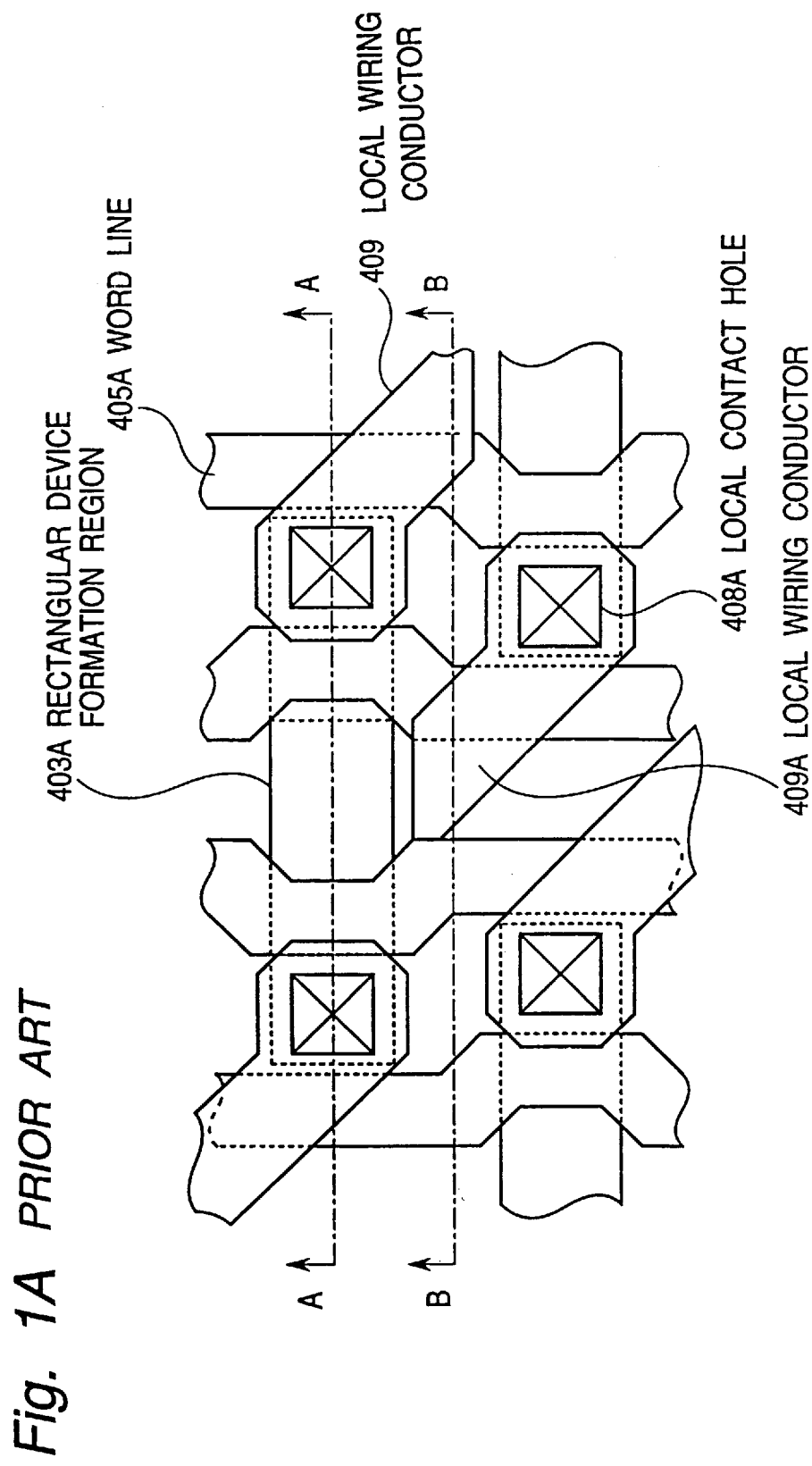
FIGS. 1A, 1B and 1C are layout diagrams at different levels, for illustrating the positional relations between various constituents of the first prior art memory cells.
Figure 1B:
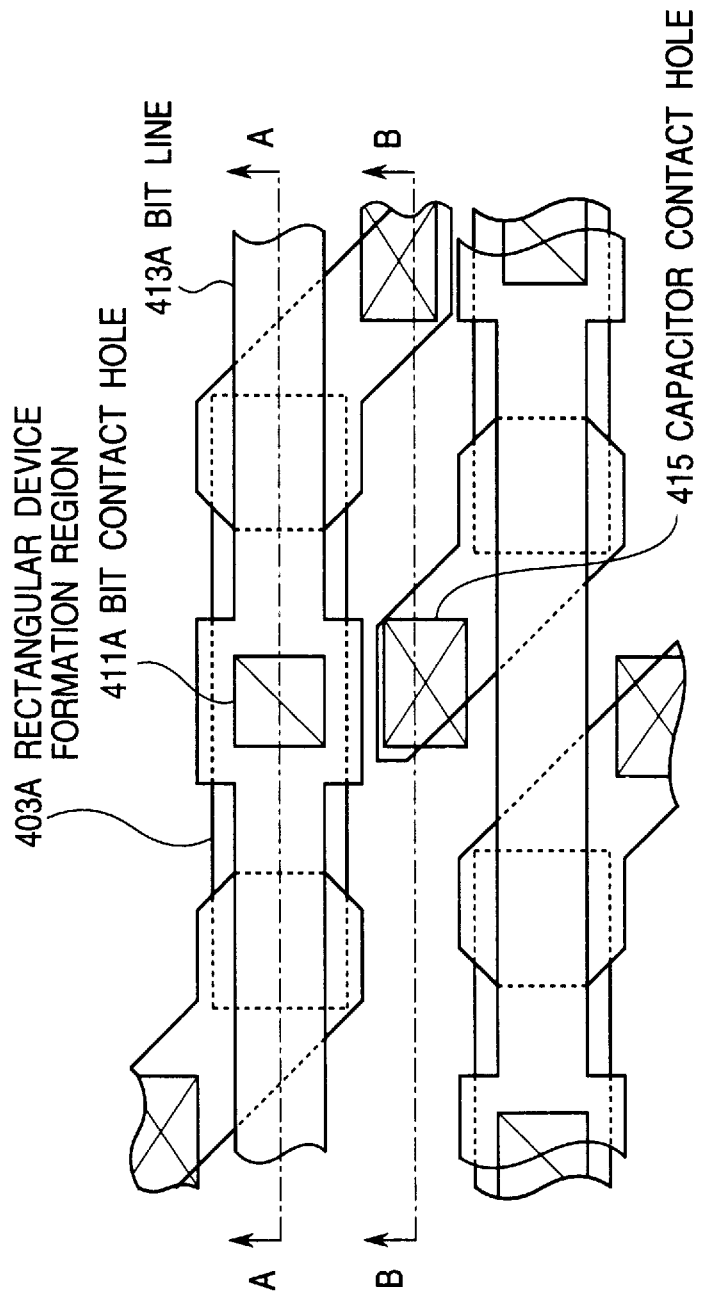
Figure 1C:
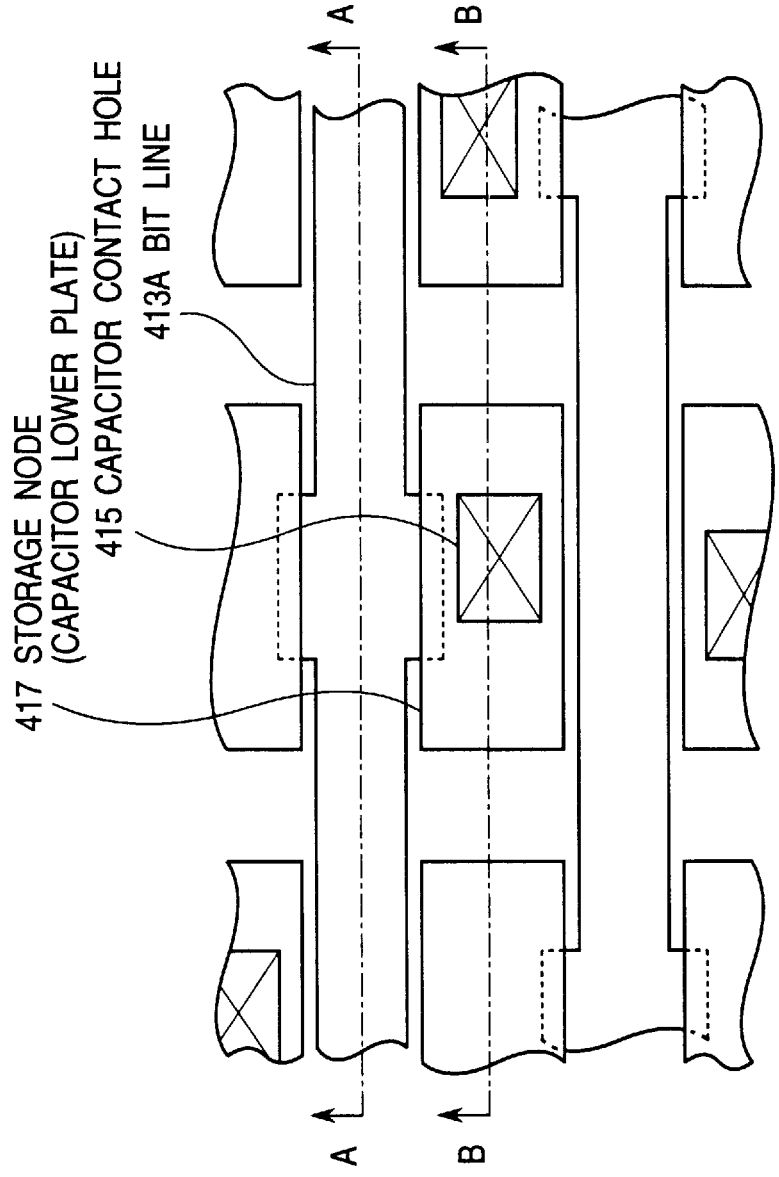
Figure 2A:
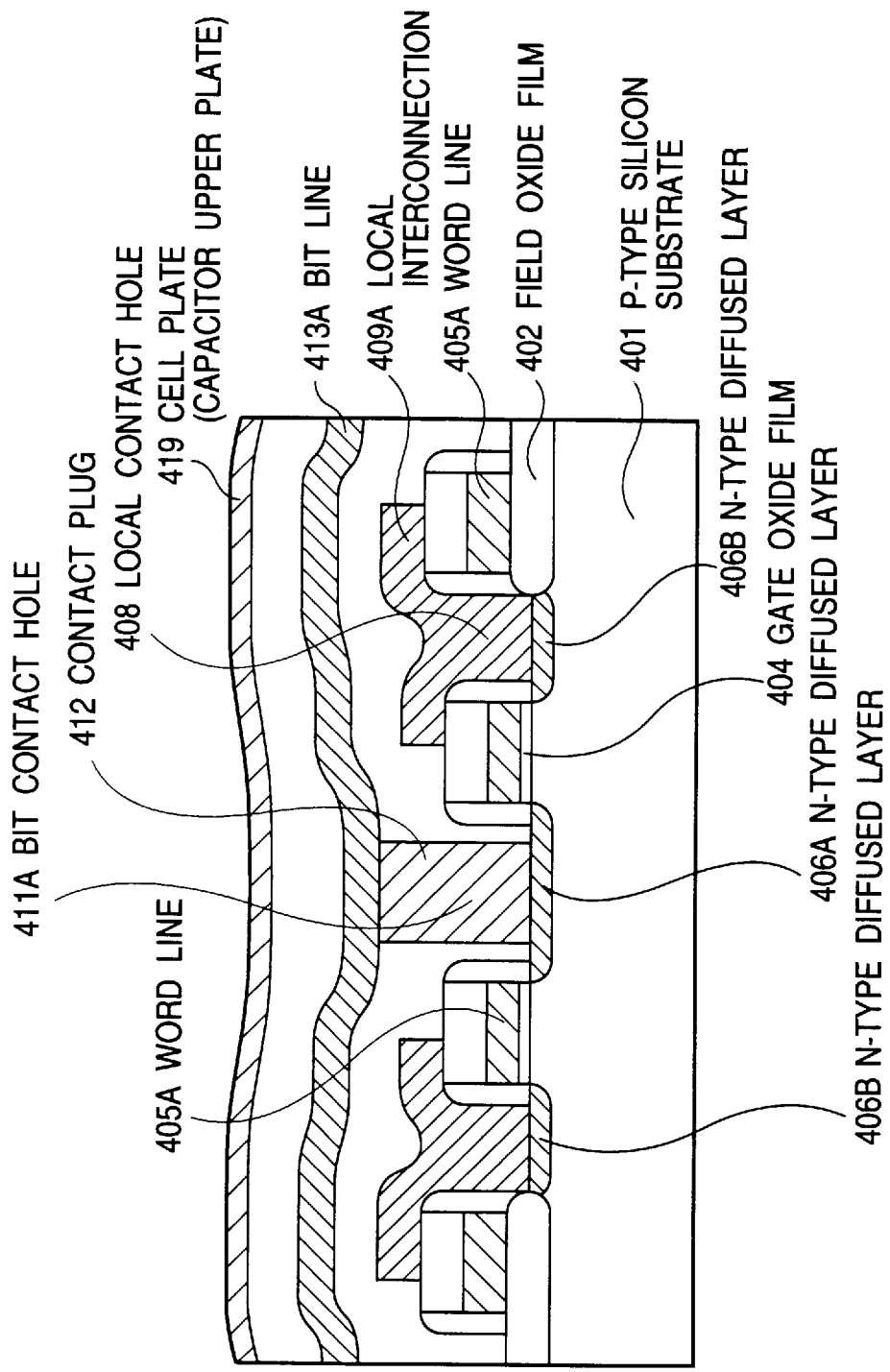
Figure 3:
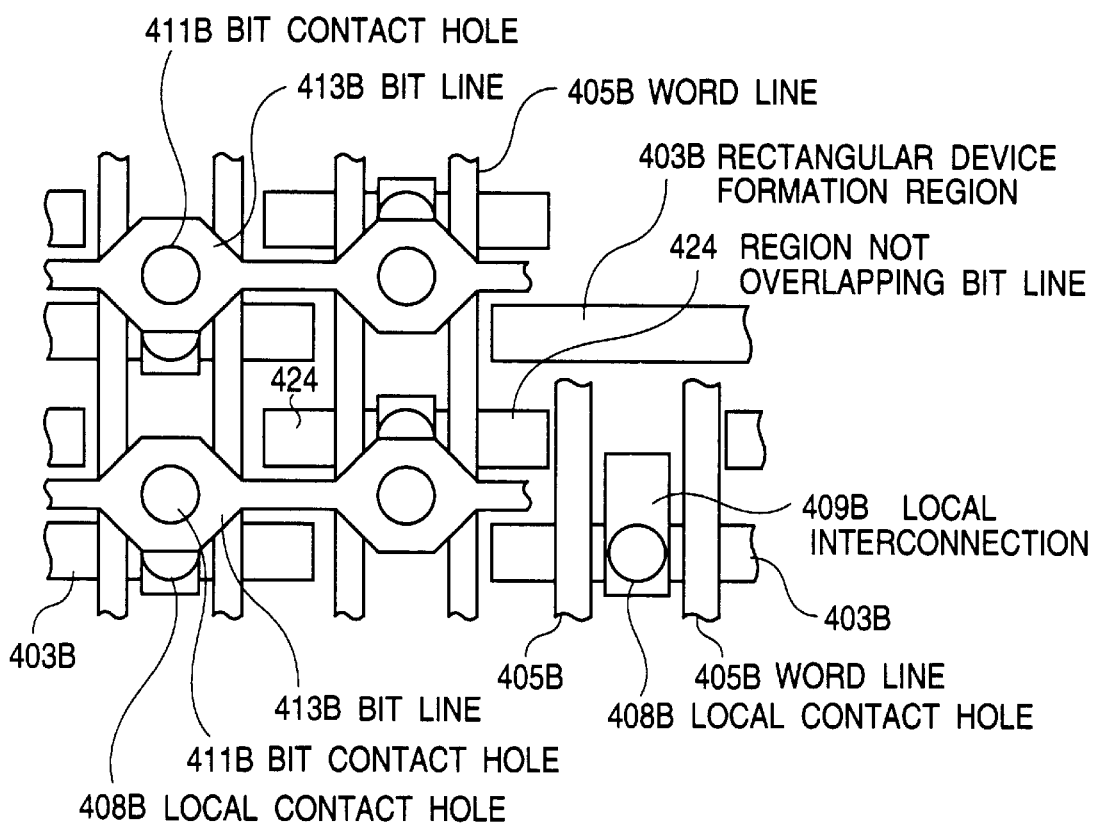
FIG. 3 is a layout diagram for illustrating the positional relations between various constituents of the second prior art memory cells, with the bit line being partially removed out for showing a layout structure under the bit line.
Figure 4C:
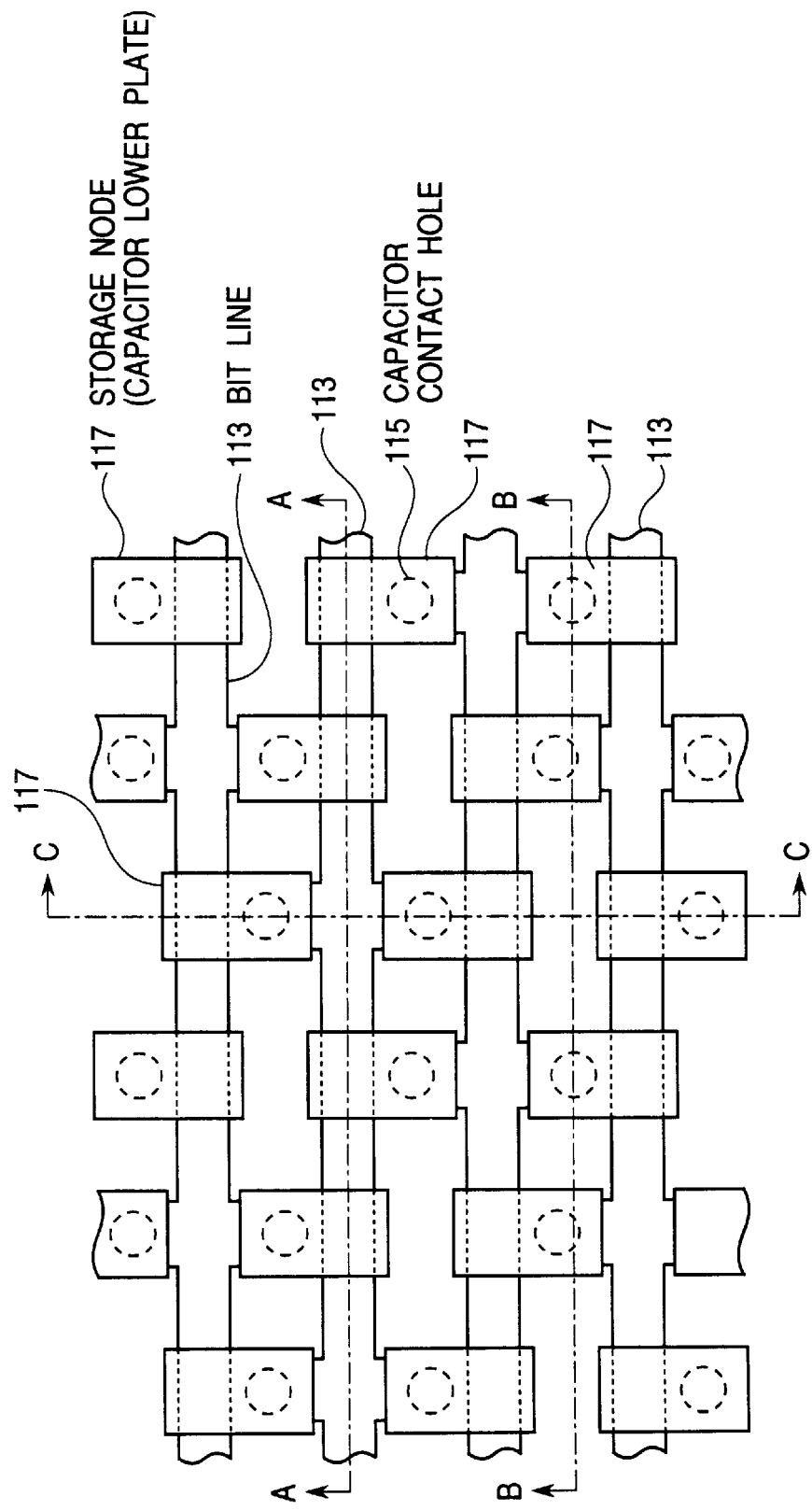
Figure 5A:
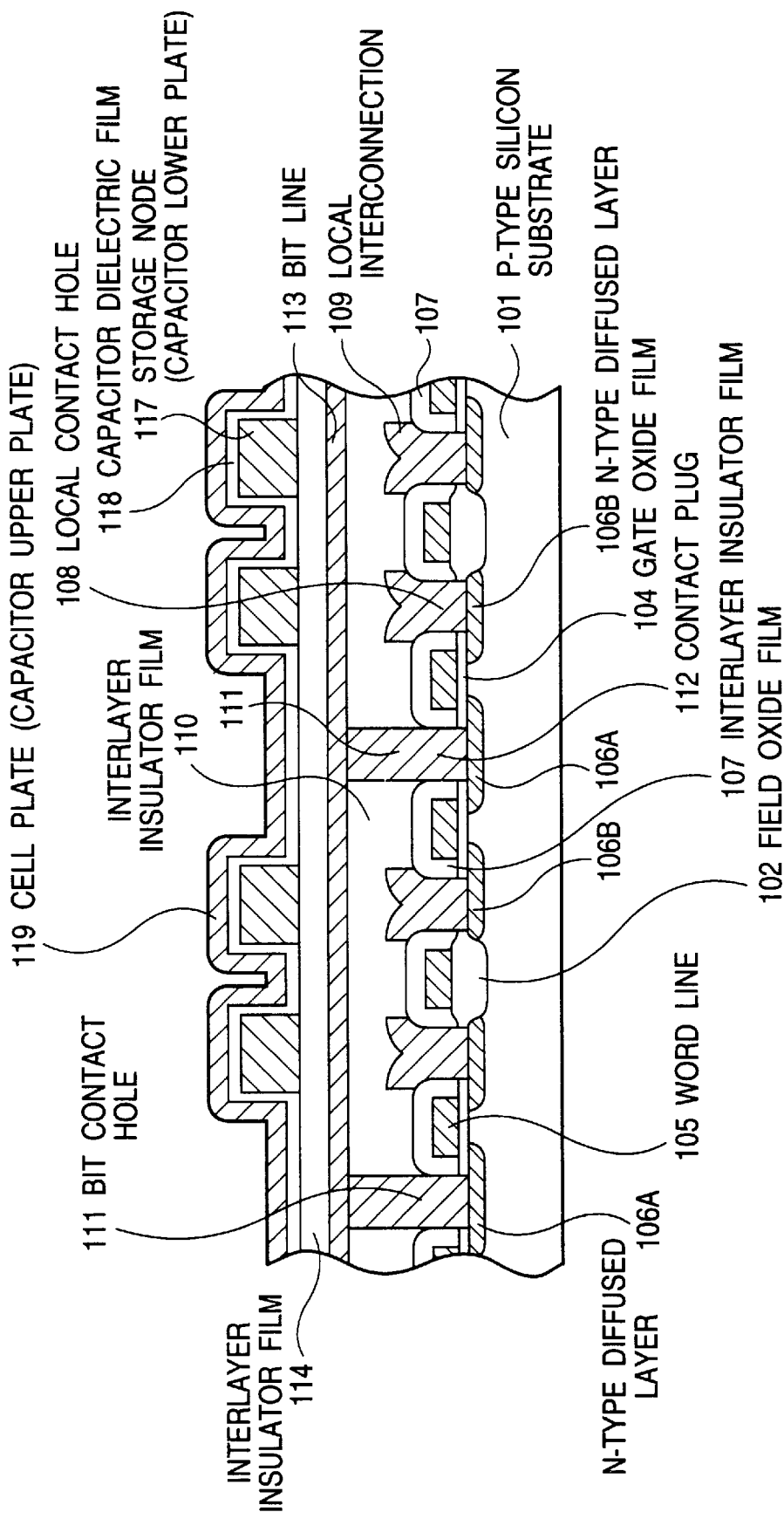
Figure 6:
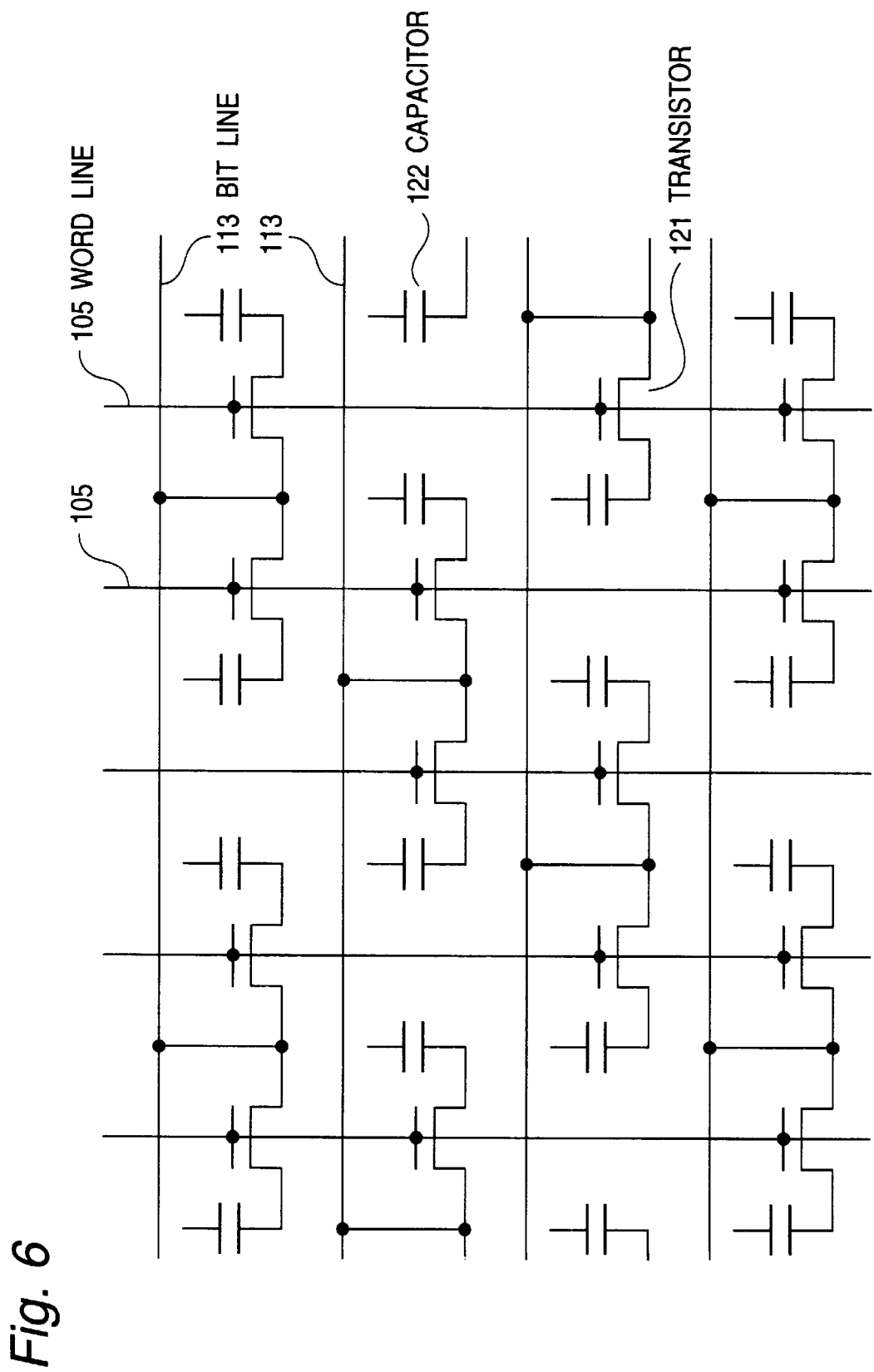
FIG. 6 is a circuit diagram of the first embodiment of the DRAM in accordance with the present invention shown in FIGS. 4A, 4B and 4C and FIGS. 5A, 5B and 5C.

Now, a first embodiment of the DRAM in accordance with the present invention will be described with reference to FIGS. 4A, 4B and 4C, FIGS. 5A, 5B and 5C, and FIG. 6. FIGS. 4A, 4B and 4C are layout diagrams at different levels, for illustrating the positional relations between various constituents of the first embodiment of the DRAM in accordance with the present invention, and FIG. 4A illustrates a positional relation between a device formation region, a word line and a local interconnection. FIG. 4B illustrates a positional relation between the word line, the local interconnection and a bit line, and FIG. 4C illustrates a positional relation between the bit line and a capacitor storage node (capacitor lower plate). FIGS. 5A, 5B and 5C are sectional views taken along the line A—A, along the line B—B, and along the line C—C in FIGS. 4A, 4B and 4C, respectively. FIG. 6 is a circuit diagram of the first embodiment of the DRAM in accordance with the present invention shown in FIGS. 4A, 4B and 4C and FIGS. 5A, 5B and 5C.

A field oxide film 102 is formed in a device isolation region on a principal surface of a P-type silicon substrate 101, so that a number of rectangular device formation regions 103 confined by the field oxide film 102 are formed on the principal surface of the P-type silicon substrate 101. The rectangular device formation regions 103 are arranged to form a plurality of rectangular device formation region arrays extending along a long side of each rectangular device formation region 103, and two adjacent rectangular device formation regions 103 included in two different but adjacent rectangular device formation region arrays, respectively, are staggered in order by one third (2 F) of a pitch (6 F) of the rectangular device formation regions in a bit line direction along the long side of each rectangular device formation region 103. In each rectangular device formation region 103, two transistors 121 (in FIG. 6) are formed. A pitch of the device formation region arrays is 2 F in a word line direction orthogonal to the long side of each rectangular device formation region 103.

In each rectangular device formation region 103, a gate oxide film 104 is formed on the principal surface of the P-type silicon substrate 101, and two word lines 105 each acting as a gate electrode are formed to extend on the gate oxide film 104, to extend orthgonally to the long side of each rectangular device formation region 103. The word lines 105 are located with a pitch of 2 F in the bit line direction. In addition, in each rectangular device formation region 103, one N-type diffused layer 106A and two N-type diffused layers 106B are formed in self alignment with the word lines 105 and the field oxide film 102. Each one transistor 121 (in FIG. 6) is constituted of the P-type silicon substrate 101, the gate oxide film 104, one word line 105, the common N-type diffused layer 106A and one of the two N-type diffused layers 106B formed in each rectangular device formation region 103.

A first level interlayer insulator film 107 is formed to cover each transistor 121 and the field oxide film 102, and a local contact hole 108 is formed to penetrate through the interlayer insulator film 107 to reach to each N-type diffused layer 106B. A local interconnected 109 is connected directly through the local contact hole 108 to the N-type diffused layer 106B, and extends over the field oxide film 102 in parallel to the word lines 105. In addition, a pair of local interconnections 109 connected to each one rectangular device formation region 103 extend in an opposite direction to each other from the associated local contact hole 108. Since an upper end of the local contact hole 108 is positioned at a level higher than that of the word line 105, the local interconnection 109 excluding a portion thereof filling the local contact hole 108 is also positioned at a level higher than that of the word line 105.

A second level interlayer insulator film 110 is formed to cover the local interconnections 109 and the first level interlayer insulator film 107, and a bit contact hole 111 is formed to penetrate through the second and first level interlayer insulator films 110 and 107 to reach to each N-type diffused layer 106A. Each bit contact hole 111 is filled with a contact plug 112 which is connected directly to the N-type diffused layer 106A. A number of bit lines 113 are formed on a surface of the second level interlayer insulator film 110 in such a manner that each of the bit lines 113 is connected directly to corresponding contact plugs 112 at an upper end of the bit contact holes 111, so that the bit line 113 is electrically connected to corresponding N-type diffused layers 106A. The bit lines 113 are formed at a level higher than that of the word lines 105 and the local interconnections 109, and extend above the device formation region arrays and are located with a pitch of 2 F in a word line direction.

A third level interlayer insulator film 114 is formed to cover the bit lines 113 and the second level interlayer insulator film 110, and a capacitor contact hole 115 is formed to penetrate through the third and second level interlayer insulator films 114 and 110 to reach to an end of each local interconnection 109, positioned on the field oxide film 102. Each capacitor contact hole 115 is filled with a contact plug 116 which is connected directly to the local interconnection 109. A storage node electrode 117 (constituting a capacitor lower plate) is formed on the third level interlayer insulator film 114, in alignment with a corresponding capacitor contact hole 115 so that the storage node electrode 117 is connected to a corresponding contact plug 116 at an upper end of the capacitor contact hole 115, and therefore, is electrically connected to a corresponding local interconnection 109. Since an upper end of the capacitor contact hole 115 is positioned at a level higher than that of the bit line 113, the storage node electrode 117 is also positioned at a level higher than those of the word line 105 and the bit line 113. A storage capacitor 122 (in FIG. 6) is formed of the storage node electrode 117, a capacitor dielectric film (insulator film) 118 covering a surface of the storage node electrode 117, and a cell plate 119 covering the capacitor dielectric film 118 and constituting a capacitor upper plate. For example, the capacitor dielectric film 118 and the cell plate 119 are formed in common to all storage capacitors.

As seen from the above, in the first embodiment of the DRAM, the rectangular device formation regions 103 are located in such a manner that two adjacent rectangular device formation regions 103 included in two different but adjacent rectangular device formation region arrays (extending along the long side of each rectangular device formation region 103), respectively, are staggered in order by one third (2 F) of a pitch (6 F) of the rectangular device formation regions in a bit line direction along the long side of each rectangular device formation region 103, and the local interconnection 109 connected to each N-type diffused layer 106B is provided in parallel to the word lines 105. With this arrangement, not only the bit line direction pitch of the rectangular device formation regions 103 can be made to 6 F, but also the word line direction pitch of the rectangular device formation regions 103 can be made to 2 F, so that the cell size of the open-bit-line type COB structure memory cells can be easily made to 6 $F^2$.

In the first embodiment of the DRAM, the memory cells each composed of one transistor 121 and one associated capacitor 122 can be located in the following two fashions. Assuming that "n" and "m" are natural number, if memory cells connected to the bit line at an (n)th address belong to word lines at a (3m−2)th address and at a (3m−1)th address and if memory cells connected to the bit line at an (n+1)th address belong to word lines at a (3m−1)th address and at a (3m)th address, memory cells connected to the bit line at an (n−1)th address belong to word lines at a (3m−2)th address and at a (3m)th address. Alternatively, if memory cells connected to the bit line at an (n)th address belong to word lines at a (3m−2)th address and at a (3m−1)th address and if memory cells connected to the bit line at an (n+1)th address belong to word lines at a (3m−2)th address and at a (3m)th address, memory cells connected to the bit line at an (n−1)th address belong to word lines at a (3m−1)th address and at a (3m)th address.

Second Embodiment

Figure 7B:
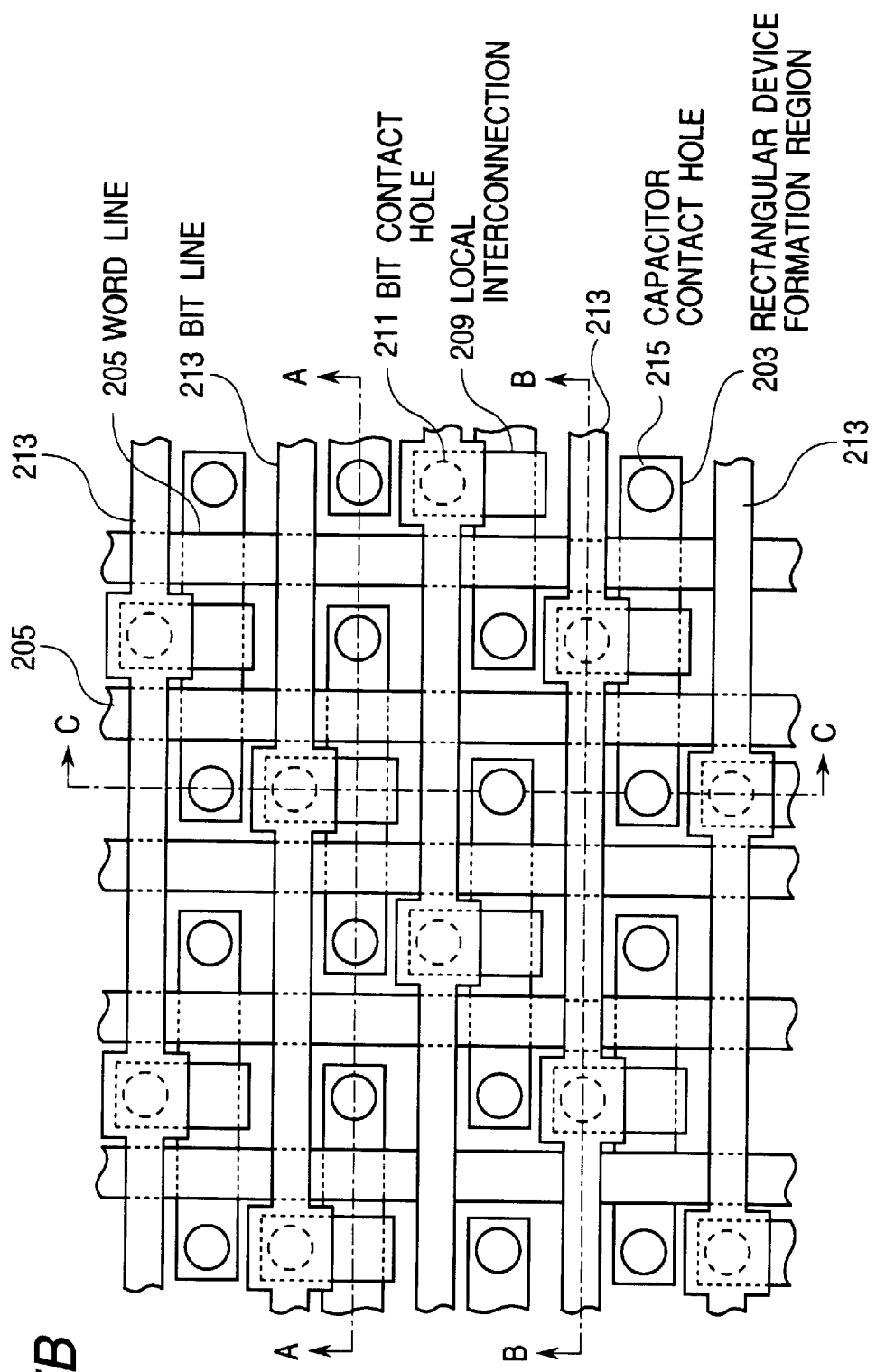
Figure 7C:
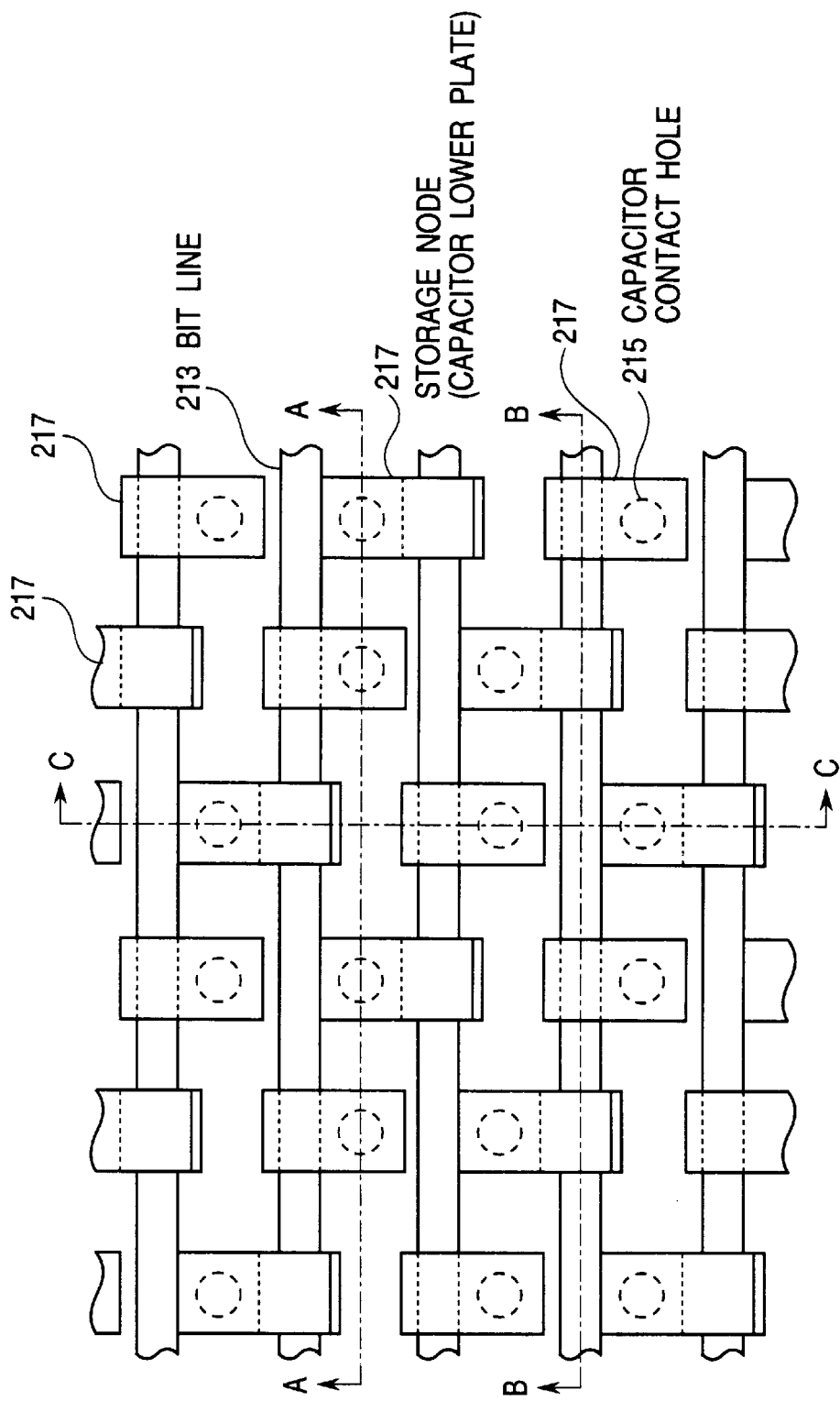
Figure 8A:
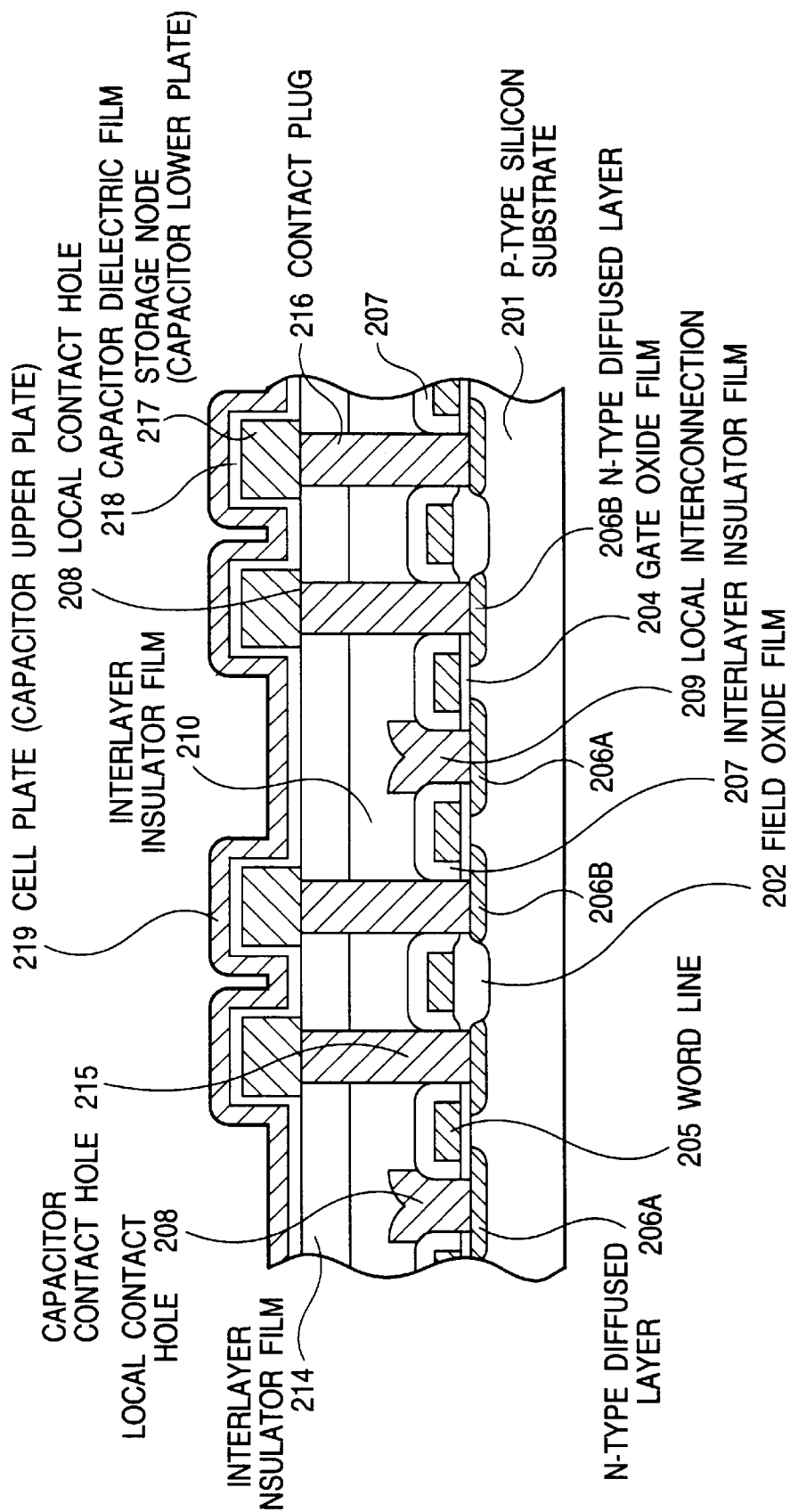
FIGS. 8A, 8B and 8C are sectional views taken along the line A—A, along the line B—B, and along the line C—C in FIGS. 7A, 7B and 7C, respectively.
Figure 8B:
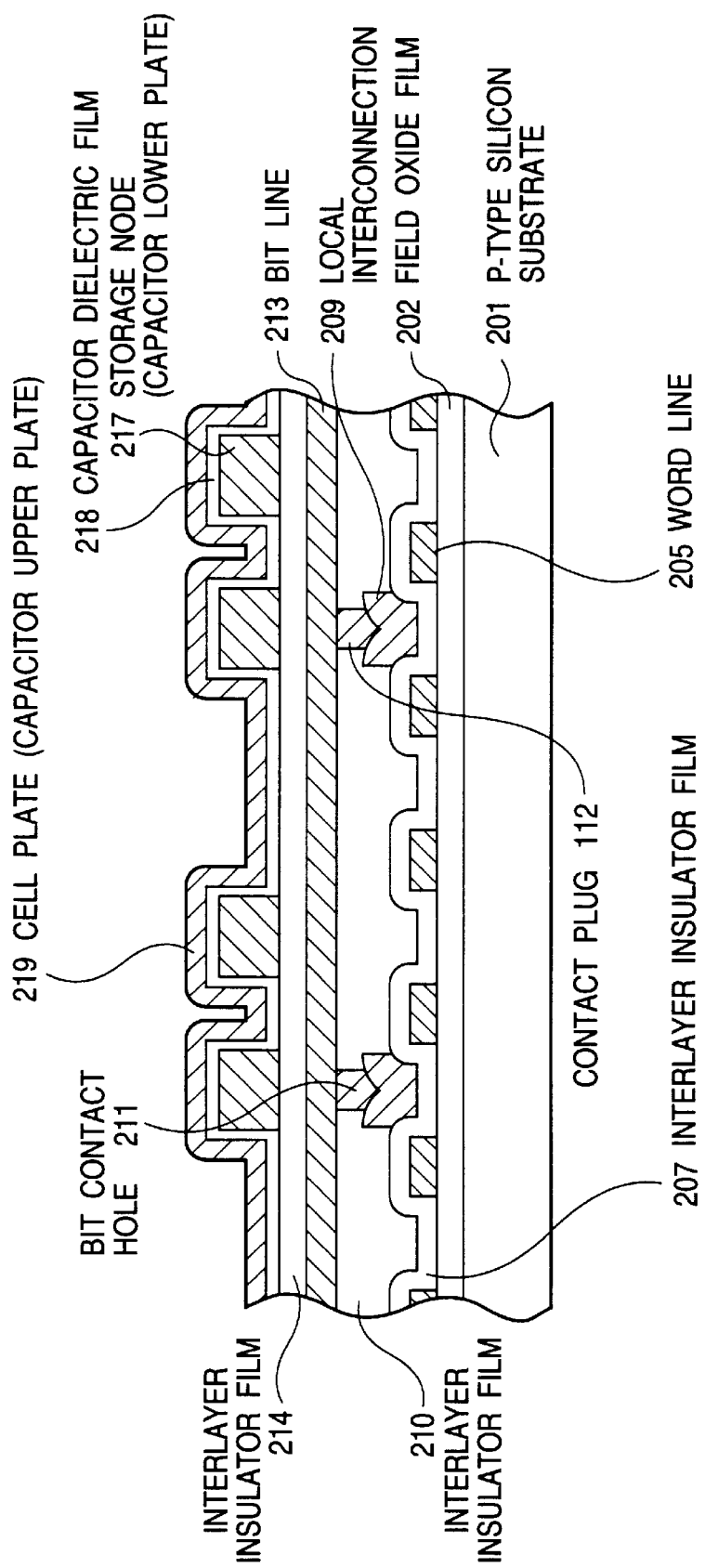
Figure 8C:
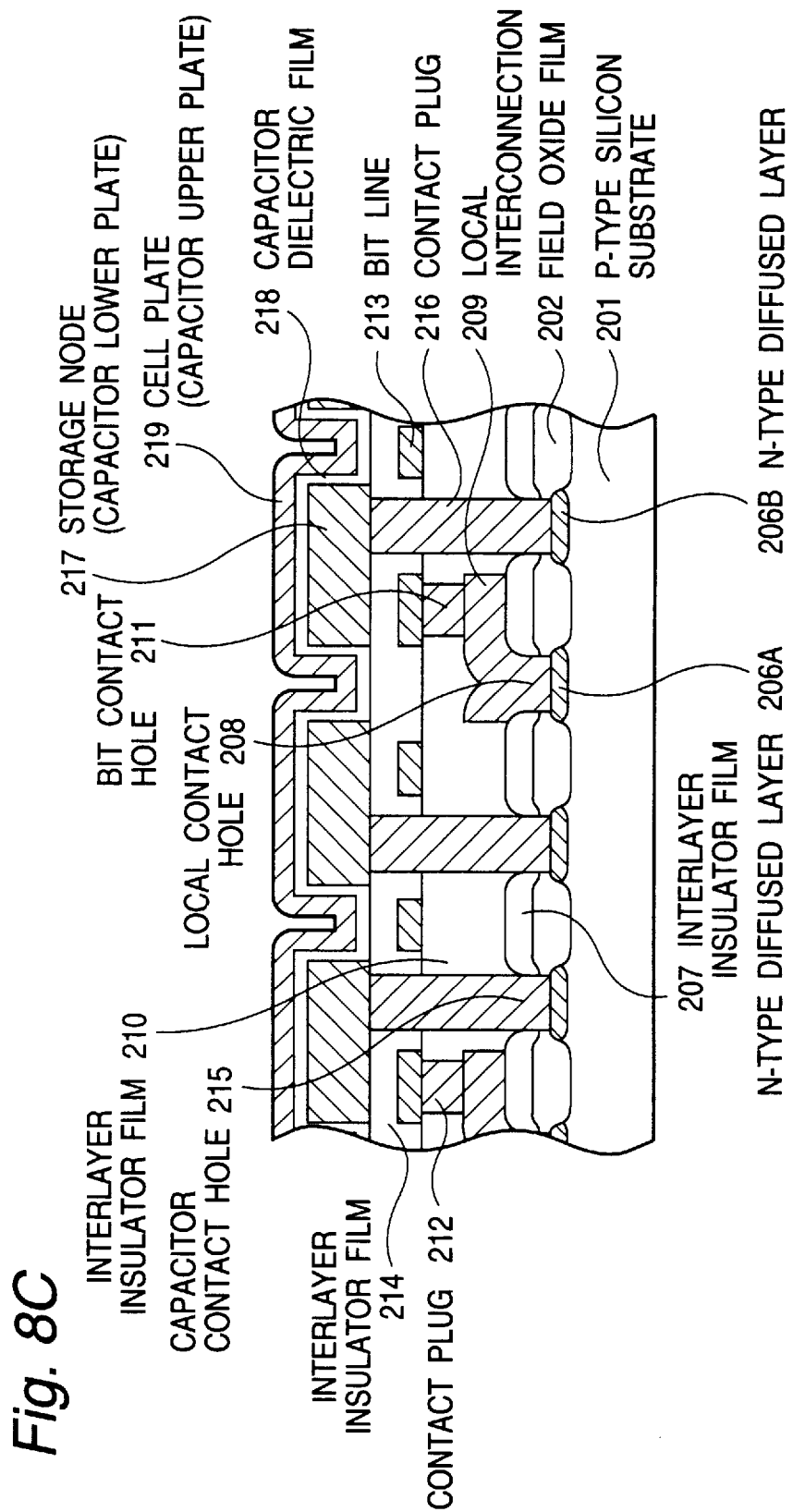
Figure 9:
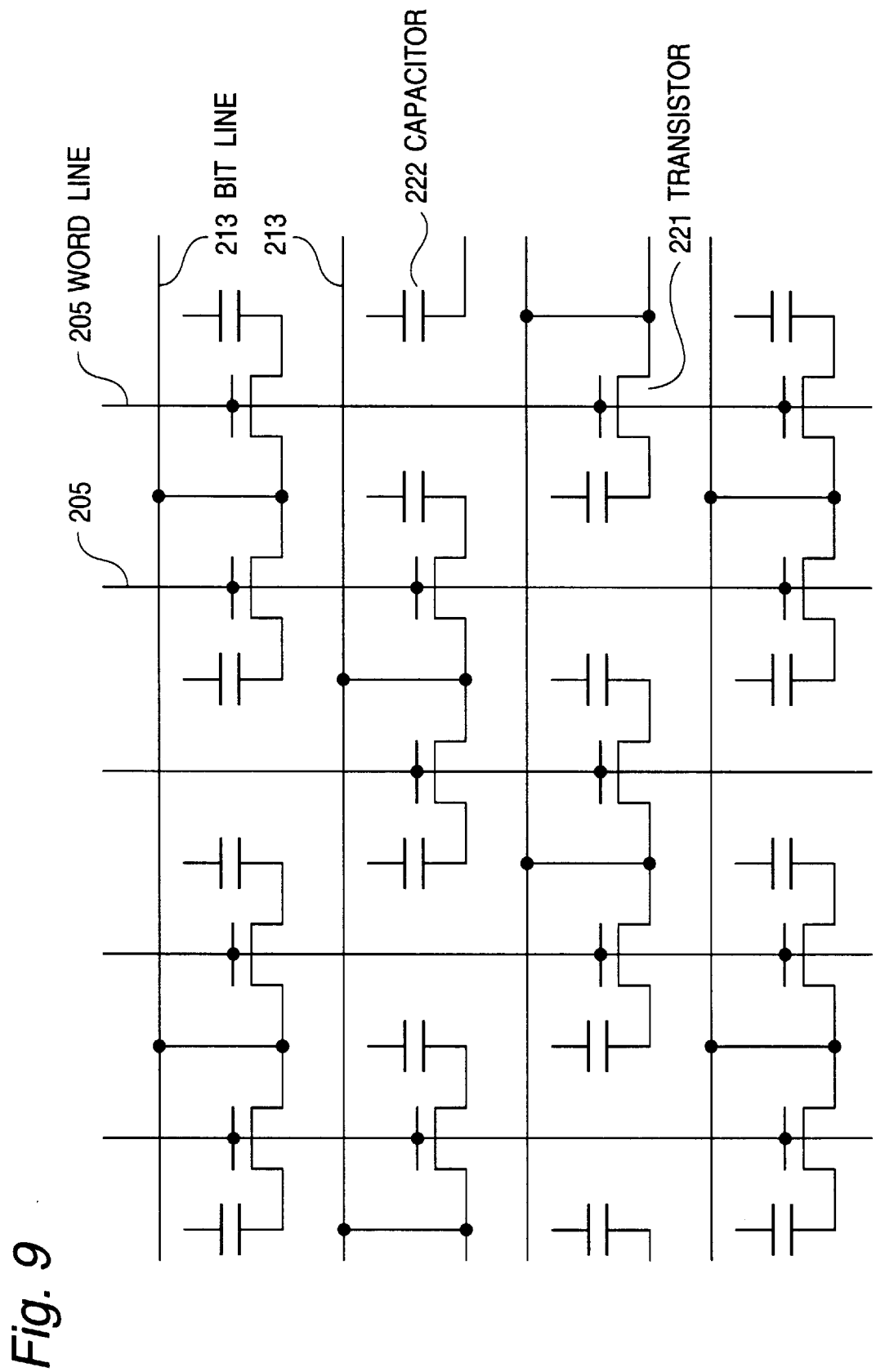
FIG. 9 is a circuit diagram of the second embodiment of the DRAM in accordance with the present invention shown in FIGS. 7A, 7B and 7C and FIGS. 8A, 8B and 8C.

Now, a second embodiment of the DRAM in accordance with the present invention will be described with reference to FIGS. 7A, 7B and 7C, FIGS. 8A, 8B and 8C, and FIG. 9. FIGS. 7A, 7B and 7C are layout diagrams at different levels, for illustrating the positional relations between various constituents of the second embodiment of the DRAM in accordance with the present invention, and FIG. 7A illustrates a positional relation between a device formation region, a word line and a local interconnection. FIG. 7B illustrates a positional relation between the word line, the local interconnection and a bit line, and FIG. 7C illustrates a positional relation between the bit line and a capacitor storage node (capacitor lower plate). FIGS. 8A, 8B and 8C are sectional views taken along the line A—A, along the line B—B, and along the line C—C in FIGS. 7A, 7B and 7C, respectively. FIG. 9 is a circuit diagram of the second embodiment of the DRAM in accordance with the present invention shown in FIGS. 7A, 7B and 7C and FIGS. 8A, 8B and 8C. As seen from comparison between FIGS. 6 and 9, the circuit diagram of FIG. 9 is substantially the same as that of FIG. 6, and therefore, the DRAM having substantially the same equivalent circuit can be realized in the first and second embodiments.

A field oxide film 202 is formed in a device isolation region on a principal surface of a P-type silicon substrate 201, so that a number of rectangular device formation regions 203 confined by the field oxide film 202 are formed on the principal surface of the P-type silicon substrate 201. The rectangular device formation regions 203 are arranged to form a plurality of rectangular device formation region arrays extending along a long side of each rectangular device formation region 203, and two adjacent rectangular device formation regions 203 included in two different but adjacent rectangular device formation region arrays, respectively, are staggered in order by one third (2 F) of a pitch (6 F) of the rectangular device formation regions in a bit line direction along the long side of each rectangular device formation region 203. In each rectangular device formation region 203, two transistors 221 (in FIG. 9) are formed. A pitch of the device formation region arrays is 2 F in a word line direction orthogonal to the long side of each rectangular device formation region 203.

In each rectangular device formation region 203, a gate oxide film 204 is formed on the principal surface of the P-type silicon substrate 201, and two word lines 205 each acting as a gate electrode are formed to extend on the gate oxide film 204, to extend orthgonally to the long side of each rectangular device formation region 203. The word lines 205 are located with a pitch of 2 F in the bit line direction. In addition, in each rectangular device formation region 203, one N-type diffused layer 206A and two N-type diffused layers 206B are formed in self alignment with the word lines 205 and the field oxide film 202. Each one transistor 221 (in FIG. 9) is constituted of the P-type silicon substrate 201, the gate oxide film 204, one word line 205, the common N-type diffused layer 206A and one of the two N-type diffused layers 206B formed in each rectangular device formation region 203.

A first level interlayer insulator film 207 is formed to cover each transistor 221 and the field oxide film 202, and a local contact hole 208 is formed to penetrate through the interlayer insulator film 207 to reach to each N-type diffused layer 206A. A local interconnection 209 is connected directly through the local contact hole 208 to the N-type diffused layer 206A, and all the local interconnections 209 extend over the field oxide film 202 in parallel to the word lines 205 and in the same (vectorial) direction from the local contact hole 208. Since an upper end of the local contact hole 208 is positioned at a level higher than that of the word line 205, the local interconnection 209 excluding a portion thereof filling the local contact hole 208 is also positioned at a level higher than that of the word line 205.

A second level interlayer insulator film 210 is formed to cover the local interconnections 209 and the first level interlayer insulator film 207, and a bit contact hole 211 is formed to penetrate through the second level interlayer insulator film 210 to reach to an end of each local interconnection 209, positioned on the field oxide film 202. Each bit contact hole 211 is filled with a contact plug 212 which is connected directly to the local interconnection 209. A number of bit lines 213 are formed on a surface of the second level interlayer insulator film 210 in such a manner that each of the bit lines 213 is connected directly to corresponding contact plugs 212 at an upper end of the bit contact holes 211, so that the bit line 213 is electrically connected through the local interconnections 209 to corresponding N-type diffused layers 206A. The bit lines 213 are formed at a level higher than that of the word lines 205 and the local interconnections 209, and extend along the device formation region arrays and are located with a pitch of 2 F in a word line direction.

A third level interlayer insulator film 214 is formed to cover the bit lines 213 and the second level interlayer insulator film 210, and a capacitor contact hole 215 is formed to penetrate through the third, second and first level interlayer insulator films 214, 210 and 207 to reach to one N-type diffused layers 206B. Each capacitor contact hole 215 is filled with a contact plug 216 which is connected directly to the N-type diffused layers 206B. A storage node electrode 217 (constituting a capacitor lower plate) is formed on the third level interlayer insulator film 214, in alignment with a corresponding capacitor contact hole 215 so that the storage node electrode 217 is connected to a corresponding contact plug 216 at an upper end of the capacitor contact hole 215, and therefore, is electrically connected to a corresponding N-type diffused layers 206B. Since an upper end of the capacitor contact hole 215 is positioned at a level higher than that of the bit line 213, the storage node electrode 217 is also positioned at a level higher than those of the word line 205 and the bit line 213. A storage capacitor 222 (in FIG. 9) is formed of the storage node electrode 217, a capacitor dielectric film (insulator film) 218 covering a surface of the storage node electrode 217, and a cell plate 219 covering the capacitor dielectric film 218 and constituting a capacitor upper plate. For example, the capacitor dielectric film 218 and the cell plate 219 are formed in common to all storage capacitors.

In the second embodiment of the DRAM as mentioned above, the storage node electrode 217 is rectangular in a plan view projected onto the principal surface of the P-type silicon substrate, and a long side of the storage node electrode 217 in the plan view extends in parallel to the word lines 205 to reach from a position above the N-type diffused layer 206B to a position above the field oxide film 202. In addition, two storage node electrodes 217 connected to the two transistors formed in each one rectangular device formation regions 203, extend along the word lines, but in an opposite direction to each other. The storage node electrodes 217 extending in the same single (or vectorial) direction are located in the same staggered fashion as that of the rectangular device formation regions 203, in the same staggering pitch as that of the rectangular device formation regions 203, namely, in synchronism with the rectangular device formation regions 203.

As seen from the above, similarly to the first embodiment, also in the second embodiment of the DRAM, the rectangular device formation regions 203 are located in such a manner that two adjacent rectangular device formation regions 203 included in two different but adjacent rectangular device formation region arrays (extending along the long side of each rectangular device formation region 203), respectively, are staggered in order by one third (2 F) of a pitch (6 F) of the rectangular device formation region in a bit line direction along the long side of each rectangular device formation region 203, and the local interconnection 209 connected between each N-type diffused layer 206A and the corresponding bit line 213 is provided in parallel to the word line 205. With this arrangement, not only the bit line direction pitch of the rectangular device formation regions 203 can be made to 6 F, but also the word line direction pitch of the rectangular device formation regions 203 can be made to 2 F, so that the cell size of the open-bit-line type COB structure memory cells can be easily made to 6 $F^2$, similarly to the first embodiment.

Similarly to the first embodiment, also in the second embodiment of the DRAM, the memory cells each composed of one transistor 221 and one associated capacitor 222 can be located in the following two fashions. Assuming that "n" and "m" are natural number, if memory cells connected to the bit line at an (n)th address belong to word lines at a (3−m2)th address and at a (3m−1)th address and if memory cells connected to the bit line at an (n+1)th address belong to word lines at a (3m−1)th address and at a (3m)th address, memory cells connected to the bit line at an (n−1)th address belong to word lines at a (3m−2)th address and at a (3m)th address. Alternatively, if memory cells connected to the bit line at an (n)th address belong to word lines at a (3m−2)th address and at a (3m−1)th address and if memory cells connected to the bit line at an (n+1)th address belong to word lines at a (3m−2)th address and at a (3m)th address, memory cells connected to the bit line at an (n−1)th address belong to word lines at a (3m−1)th address and at a (3m)th address.

In the above mentioned two embodiments, the rectangular device formation regions has been located in such a manner that two adjacent rectangular device formation regions included in two different but adjacent rectangular device formation region arrays, respectively, are staggered in order by one third of the pitch of the rectangular device formation region in a bit line direction along the long side of each rectangular device formation region. However, this staggering manner is not limited only to the above mentioned two embodiments. For example, the rectangular device formation regions can be located in such a manner that two adjacent rectangular device formation regions included in two different but adjacent rectangular device formation region arrays, respectively, are staggered alternately by one third of the pitch of the rectangular device formation region in a bit line direction along the long side of each rectangular device formation region, as will be seen from a fourth embodiment which will be described later.

Third Embodiment

Figure 10A:
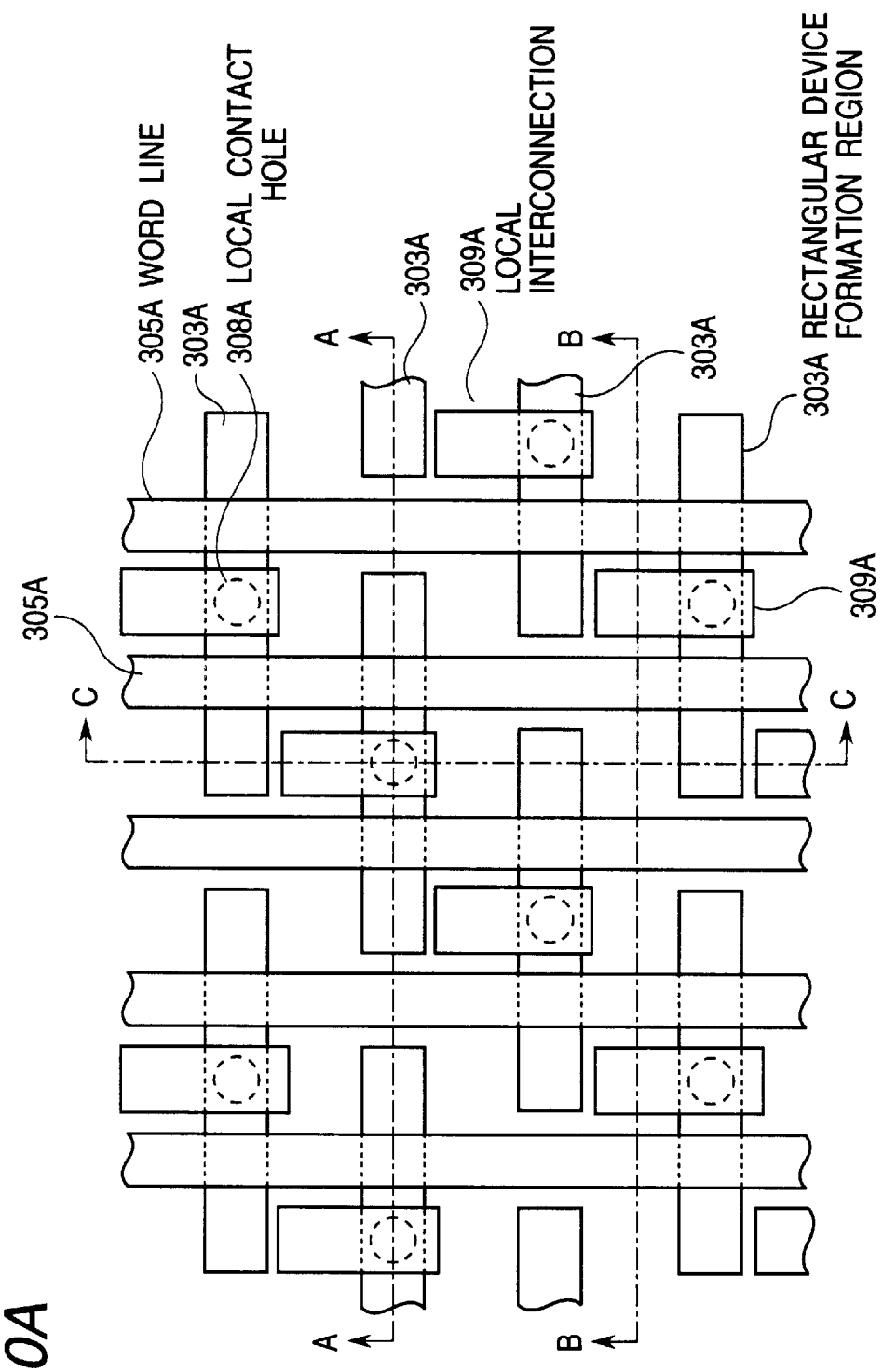
Figure 10B:
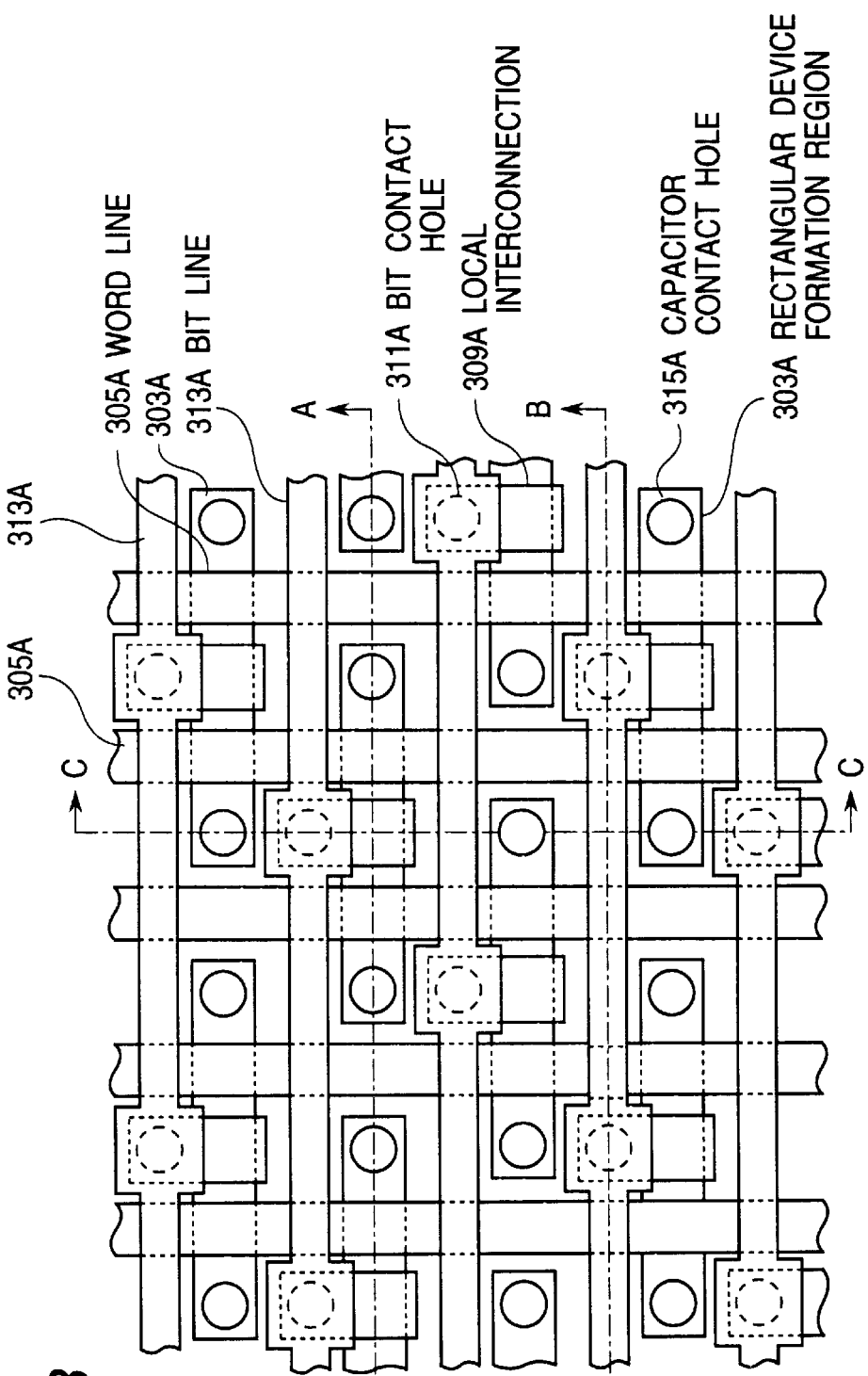
Figure 11A:
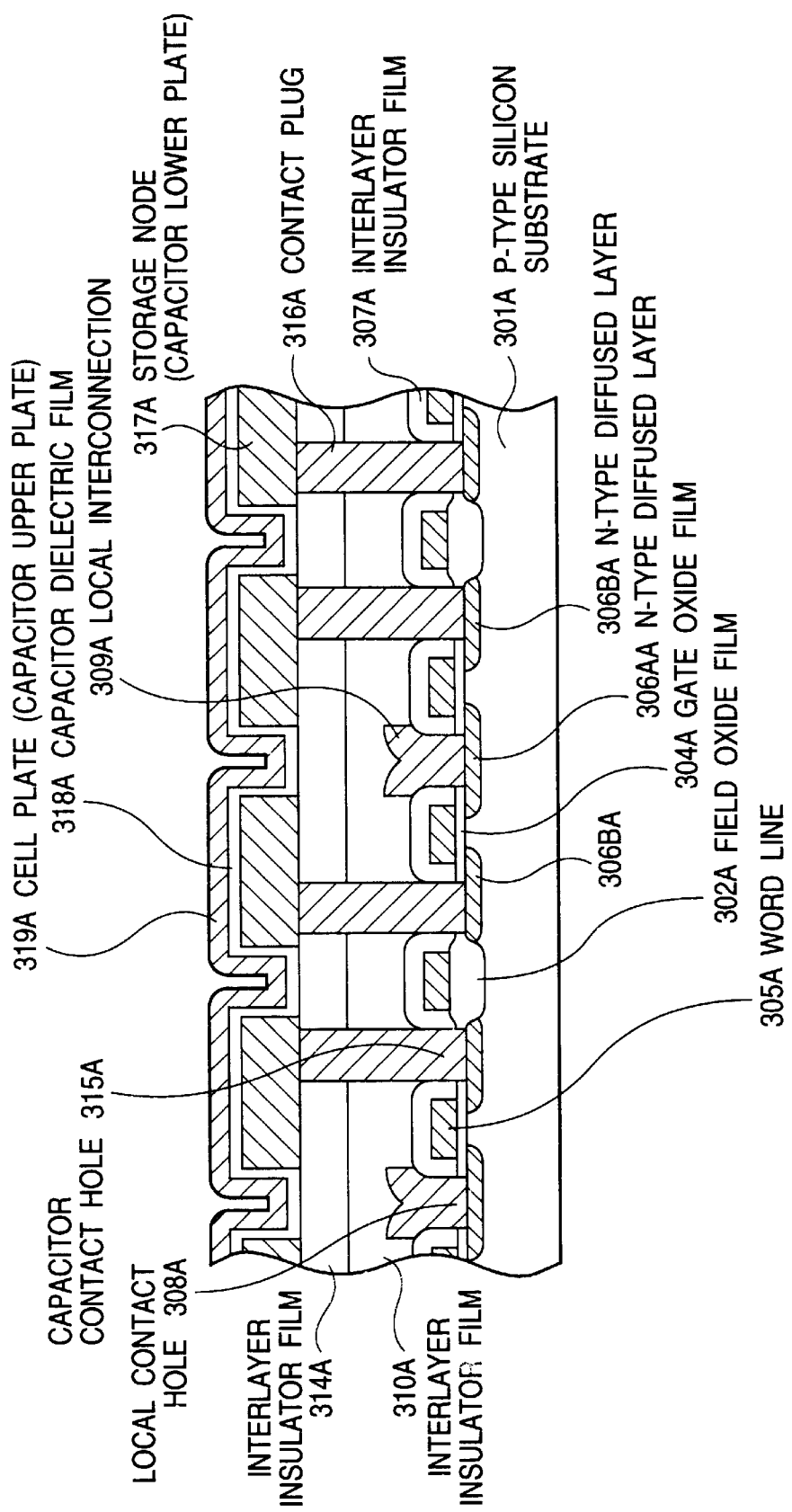
Figure 11B:
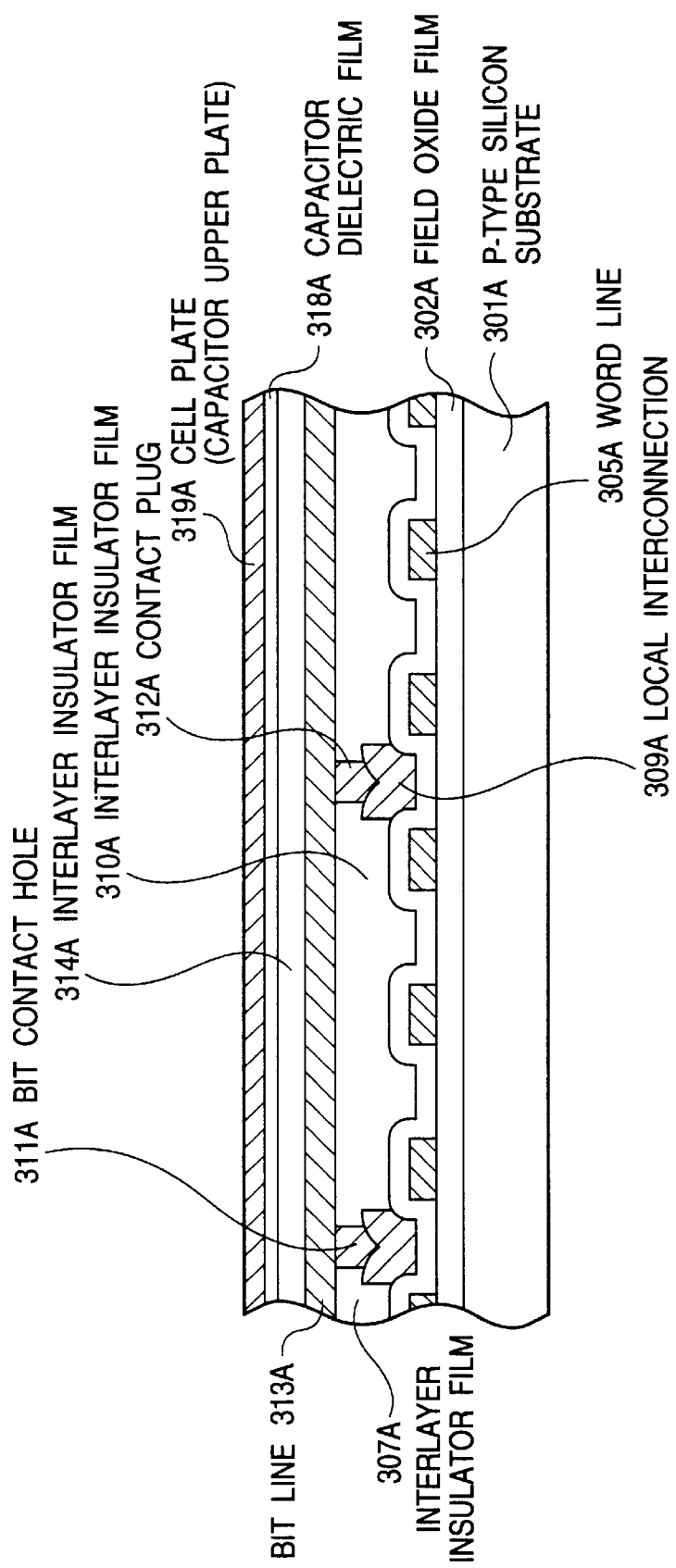
Figure 12:
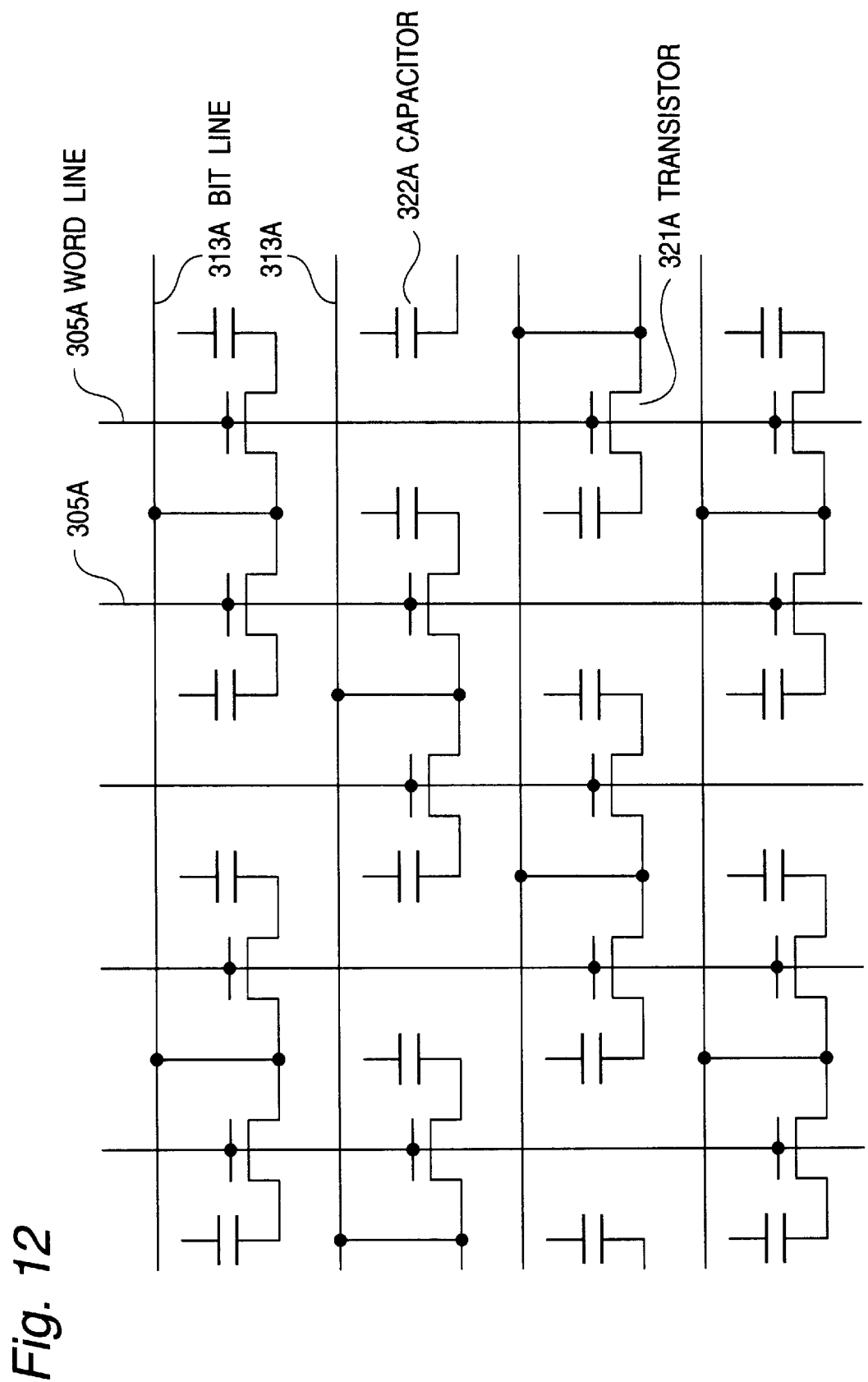
FIG. 12 is a circuit diagram of the third embodiment of the DRAM in accordance with the present invention shown in FIGS. 10A, 10B and 10C and FIGS. 11A, 11B and 11C.

Now, a third embodiment of the DRAM in accordance with the present invention will be described with reference to FIGS. 10A, 10B and 10C, FIGS. 11A, 11B and 11C, and FIG. 12. FIGS. 10A, 10B and 10C are layout diagrams at different levels, for illustrating the positional relations between various constituents of the third embodiment of the DRAM in accordance with the present invention, and FIG. 10A illustrates a positional relation between a device formation region, a word line and a local interconnection. FIG. 10B illustrates a positional relation between the word line, the local interconnection and a bit line, and FIG. 10C illustrates a positional relation between the bit line and a capacitor storage node (capacitor lower plate). FIGS. 11A, 11B and 11C are sectional views taken along the line A—A, along the line B—B, and along the line C—C in FIGS. 10A, 10B and 10C, respectively. FIG. 12 is a circuit diagram of the third embodiment of the DRAM in accordance with the present invention shown in FIGS. 10A, 10B and 10C and FIGS. 11A, 11B and 11C. As seen from comparison between FIGS. 6 and 12, the circuit diagram of FIG. 12 is substantially the same as that of FIG. 6, and therefore, the DRAM having substantially the same equivalent circuit can be realized in the first and third embodiments.

A field oxide film 302A is formed in a device isolation region on a principal surface of a P-type silicon substrate 301A, so that a number of rectangular device formation regions 303A confined by the field oxide film 302A are formed on the principal surface of the P-type silicon substrate 301A. The rectangular device formation regions 303A are arranged to form a plurality of rectangular device formation region arrays extending along a long side of each rectangular device formation region 303A, and two adjacent rectangular device formation regions 303A included in two different but adjacent rectangular device formation region arrays, respectively, are staggered in order by one third (2 F) of a pitch (6 F) of the rectangular device formation regions in a bit line direction along the long side of each rectangular device formation region 303A. In each rectangular device formation region 303A, two transistors 321A (in FIG. 12) are formed. A pitch of the device formation region arrays is 2 F in a word line direction orthogonal to the long side of each rectangular device formation region 303A.

In each rectangular device formation region 303A, a gate oxide film 304A is formed on the principal surface of the P-type silicon substrate 301A, and two word lines 305A each acting as a gate electrode are formed to extend on the gate oxide film 304A, to extend orthgonally to the long side of each rectangular device formation region 303A. The word lines 305A are located with a pitch of 2 F in the bit line direction. In addition, in each rectangular device formation region 303A, one N-type diffused layer 306AA and two N-type diffused layers 306BA are formed in self alignment with the word lines 305A and the field oxide film 302A. Each one transistor 321A (in FIG. 12) is constituted of the P-type silicon substrate 301A, the gate oxide film 304A, one word line 305A, the common N-type diffused layer 306AA and one of the two N-type diffused layers 306BA formed in each rectangular device formation region 303A.

A first level interlayer insulator film 307A is formed to cover each transistor 321A and the field oxide film 302A, and a local contact hole 308A is formed to penetrate through the interlayer insulator film 307A to reach to each N-type diffused layer 306AA. A local interconnection 309A is connected directly through the local contact hole 308A to the N-type diffused layer 306AA, and all the local interconnections 309A extend over the field oxide film 302A in parallel to the word lines 305A and in the same (vectorial) direction from the local contact hole 308A. Since an upper end of the local contact hole 308A is positioned at a level higher than that of the word line 305A, the local interconnection 309A excluding a portion thereof filling the local contact hole 308A is also positioned at a level higher than that of the word line 305A.

A second level interlayer insulator film 310A is formed to cover the local interconnections 309A and the first level interlayer insulator film 307A, and a bit contact hole 311A is formed to penetrate through the second level interlayer insulator film 310A to reach to an end of each local interconnection 309A, positioned on the field oxide film 302A. Each bit contact hole 311A is filled with a contact plug 312A which is connected directly to the local interconnection 309A. A number of bit lines 313A are formed on a surface of the second level interlayer insulator film 310A in such a manner that each of the bit lines 313A is connected directly to corresponding contact plugs 312A at an upper end of the bit contact holes 311A, so that the bit line 313A is electrically connected through the local interconnections 309A to corresponding N-type diffused layers 306AA. The bit lines 313A are formed at a level higher than that of the word lines 305A and the local interconnections 309A, and extend along the device formation region arrays and are located with a pitch of 2 F in a word line direction.

A third level interlayer insulator film 314A is formed to cover the bit lines 313A and the second level interlayer insulator film 310A, and a capacitor contact hole 315A is formed to penetrate through the third, second and first level interlayer insulator films 314A, 310A and 307A to reach to one N-type diffused layer 306BA. Each capacitor contact hole 315A is filled with a contact plug 316A which is connected directly to the N-type diffused layers 306BA. A storage node electrode 317A (constituting a capacitor lower plate) is formed on the third level interlayer insulator film 314A, in alignment with a corresponding capacitor contact hole 315A so that the storage node electrode 317A is connected to a corresponding contact plug 316A at an upper end of the capacitor contact hole 315A, and therefore, is electrically connected to a corresponding N-type diffused layers 306BA. Since an upper end of the capacitor contact hole 315A is positioned at a level higher than that of the bit line 313A, the storage node electrode 317A is also positioned at a level higher than those of the word line 305A and the bit line 313A.

In this third embodiment of the DRAM as mentioned above, the storage node electrode 317A is rectangular in a plan view projected onto the principal surface of the P-type silicon substrate 301A, and a long side of the storage node electrode 317A in the plan view extends in parallel to the bit lines 313A to reach from a position above the N-type diffused layer 306BA to a position above the word line 305A which extends over the same rectangular device formation regions 303A.

A storage capacitor 322A (in FIG. 12) is formed of the storage node electrode 317A, a capacitor dielectric film (insulator film) 318A covering a surface of the storage node electrode 317A, and a cell plate 319A covering the capacitor dielectric film 318A and constituting a capacitor upper plate.

As seen from the above, similarly to the first and second embodiments, also in the third embodiment of the DRAM, the rectangular device formation regions 303A are located in such a manner that two adjacent rectangular device formation regions 303A included in two different but adjacent rectangular device formation region arrays (extending along the long side of each rectangular device formation region 303A), respectively, are staggered in order by one third (2 F) of a pitch (6 F) of the rectangular device formation region in a bit line direction along the long side of each rectangular device formation region 303A, and the local interconnection 309A connected between each N-type diffused layer 306AA and the corresponding bit line 313A is provided. With this arrangement, not only the bit line direction pitch of the rectangular device formation regions 303A can be made to 6 F, but also the word line direction pitch of the rectangular device formation regions 303A can be made to 2 F, so that the cell size of the open-bit-line type COB structure memory cells can be easily made to 6 $F^2$, similarly to the first and second embodiments.

Similarly to the first and second embodiments, also in the third embodiment of the DRAM, the memory cells each composed of one transistor 321A and one associated capacitor 322A can be located in the following two fashions. Assuming that "n" and "m" are natural number, if memory cells connected to the bit line at an (n)th address belong to word lines at a (3m−2)th address and at a (3m−1)th address and if memory cells connected to the bit line at an (n+1)th address belong to word lines at a (3m−1)th address and at a (3m)th address, memory cells connected to the bit line at an (n−1)th address belong to word lines at a (3m−2)th address and at a (3m)th address. Alternatively, if memory cells connected to the bit line at an (n)th address belong to word lines at a (3m−2)th address and at a (3m−1)th address and if memory cells connected to the bit line at an (n+1)th address belong to word lines at a (3m−2)th address and at a (3m)th address, memory cells connected to the bit line at an (n−1)th address belong to word lines at a (3m−1)th address and at a (3m)th address.

Fourth Embodiment

Figure 13A:
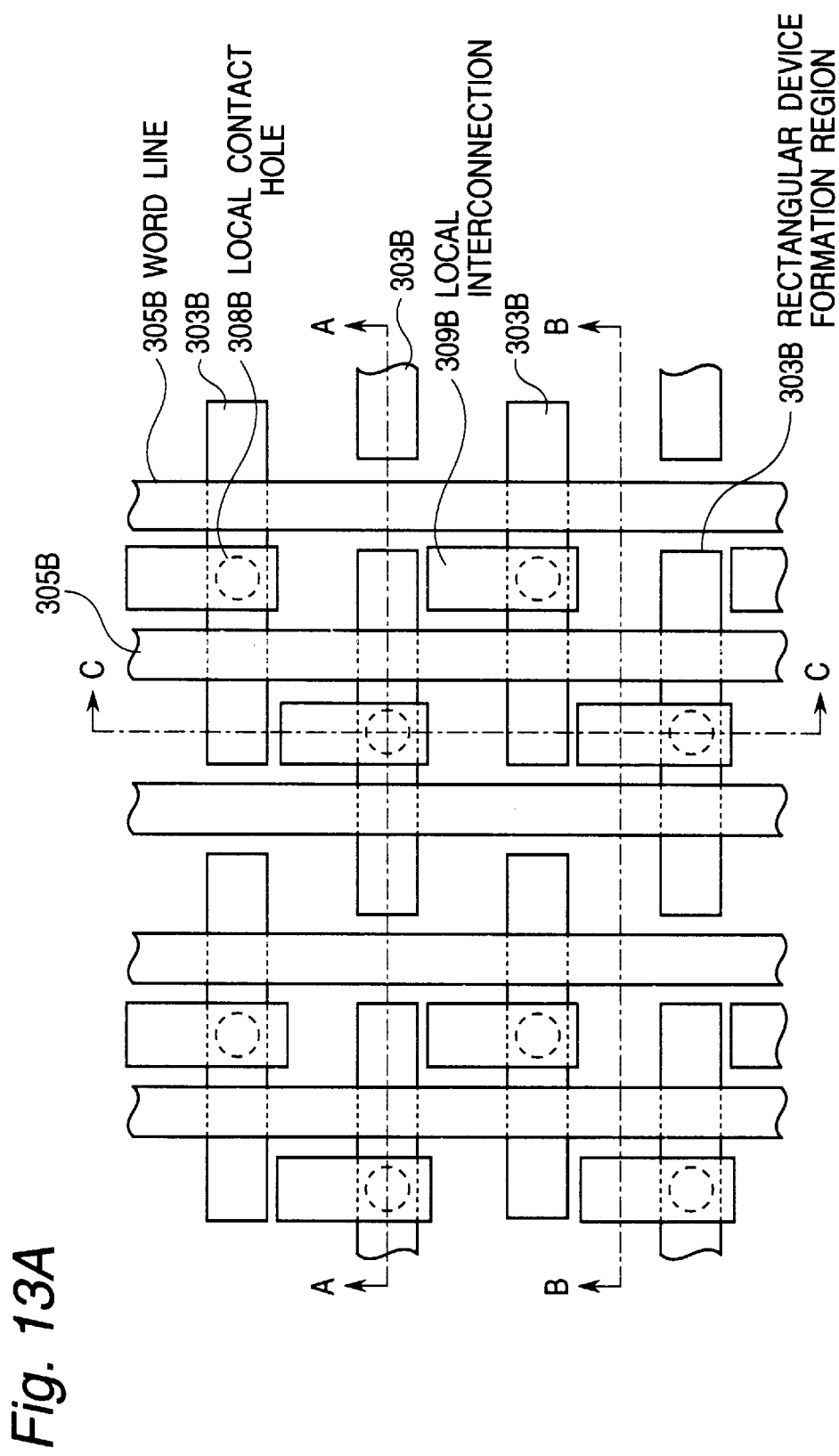
Figure 14A:
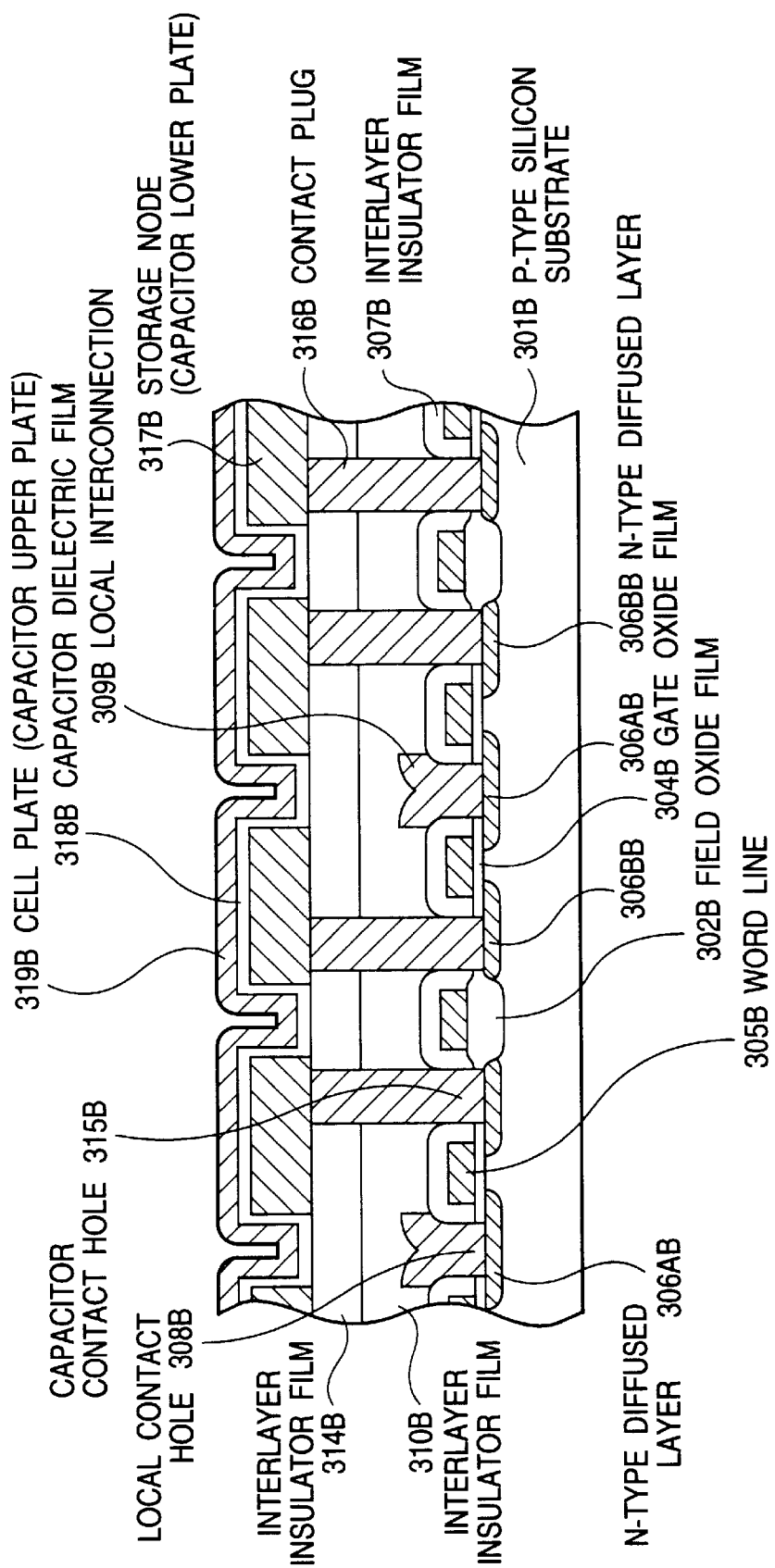
Figure 14B:
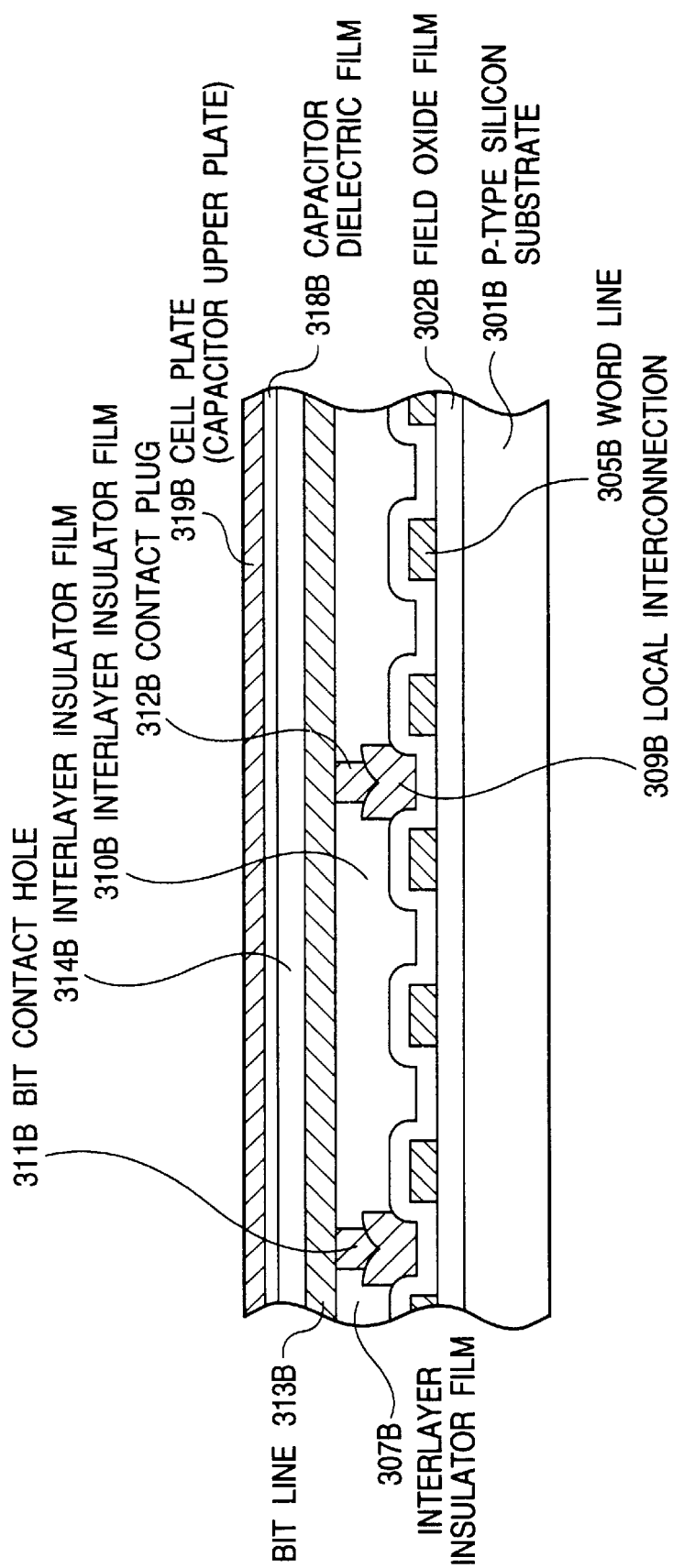
Figure 15:
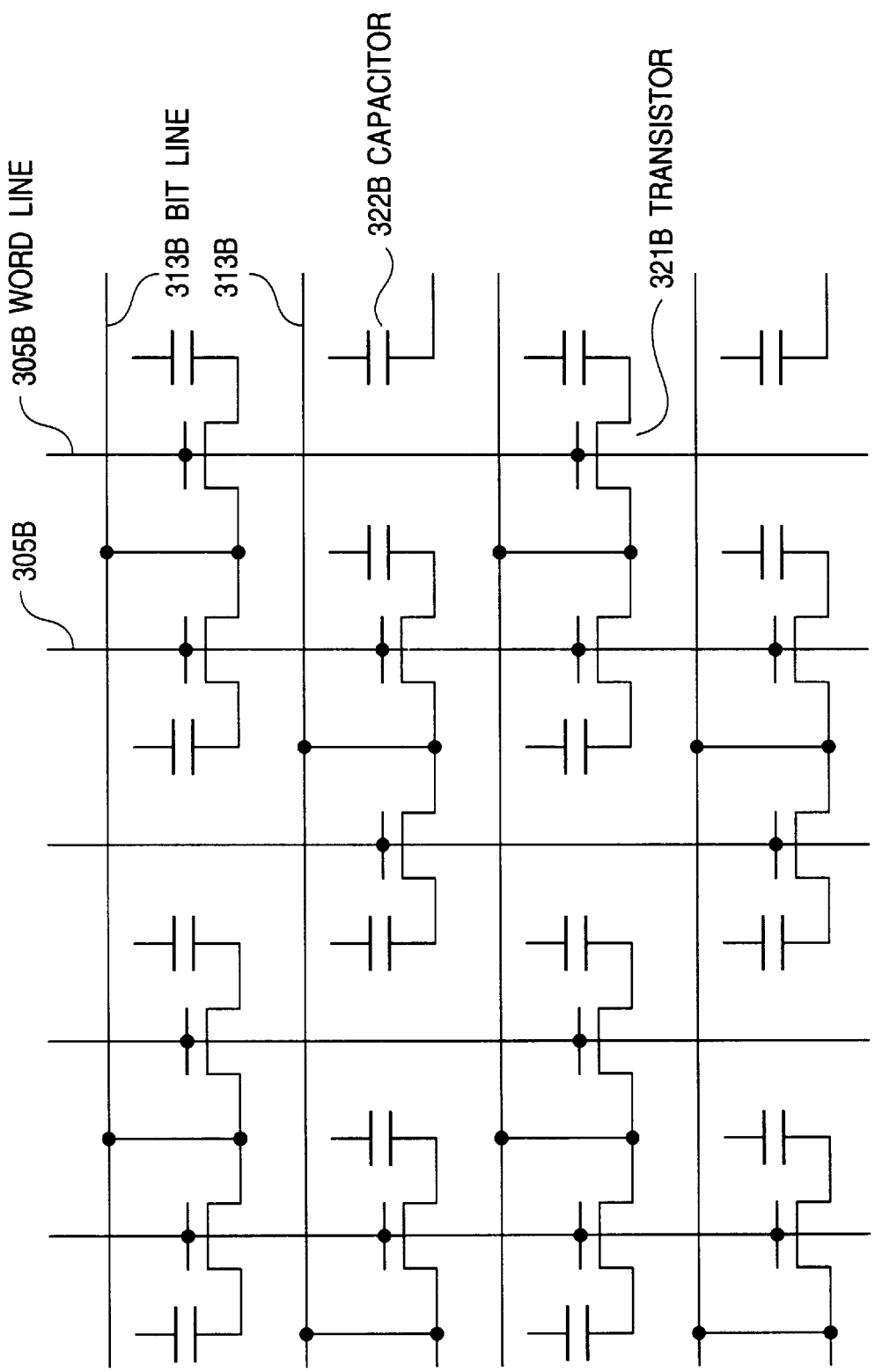
FIG. 15 is a circuit diagram of the fourth embodiment of the DRAM in accordance with the present invention shown in FIGS. 13A, 13B and 13C and FIGS. 14A, 14B and 14C.

Now, a fourth embodiment of the DRAM in accordance with the present invention will be described with reference to FIGS. 13A, 13B and 13C, FIGS. 14A, 14B and 14C, and FIG. 15. FIGS. 13A, 13B and 13C are layout diagrams at different levels, for illustrating the positional relations between various constituents of the fourth embodiment of the DRAM in accordance with the present invention, and FIG. 13A illustrates a positional relation between a device formation region, a word line and a local interconnection. FIG. 13B illustrates a positional relation between the word line, the local interconnection and a bit line, and FIG. 13C illustrates a positional relation between the bit line and a capacitor storage node (capacitor lower plate). FIGS. 14A, 14B and 14C are sectional views taken along the line A—A, along the line B—B, and along the line C—C in FIGS. 13A, 13B and 13C, respectively. FIG. 15 is a circuit diagram of the fourth embodiment of the DRAM in accordance with the present invention shown in FIGS. 13A, 13B and 13C and FIGS. 14A, 14B and 14C.

A field oxide film 302B is formed in a device isolation region on a principal surface of a P-type silicon substrate 301B, so that a number of rectangular device formation regions 303B confined by the field oxide film 302B are formed on the principal surface of the P-type silicon substrate 301B. The rectangular device formation regions 303B are arranged to form a plurality of rectangular device formation region arrays extending along a long side of each rectangular device formation region 303B, and two adjacent rectangular device formation regions 303B included in two different but adjacent rectangular device formation region arrays, respectively, are staggered alternately by one third (2 F) of a pitch (6 F) of the rectangular device formation region in a bit line direction along the long side of each rectangular device formation region 303B. In each rectangular device formation region 303B, two transistors 321B (in FIG. 15) are formed. A pitch of the device formation region arrays is 2 F in a word line direction orthogonal to the long side of each rectangular device formation region 303B.

In each rectangular device formation region 303B, a gate oxide film 304B is formed on the principal surface of the P-type silicon substrate 301B, and two word lines 305B each acting as a gate electrode are formed to extend on the gate oxide film 304B, to extend orthgonally to the long side of each rectangular device formation region 303B. The word lines 305B are located with a pitch of 2 F in the bit line direction. In addition, in each rectangular device formation region 303B, one N-type diffused layer 306AB and two N-type diffused layers 306BB are formed in self alignment with the word lines 305B and the field oxide film 302B. Each one transistor 321B (in FIG. 15) is constituted of the P-type silicon substrate 301B, the gate oxide film 304B, one word line 305B, the common N-type diffused layer 306AB and one of the two N-type diffused layers 306BB formed in each rectangular device formation region 303B.

A first level interlayer insulator film 307B is formed to cover each transistor 321B and the field oxide film 302B, and a local contact hole 308B is formed to penetrate through the interlayer insulator film 307B to reach to each N-type diffused layer 306AB. A local interconnection 309B is connected directly through the local contact hole 308B to the N-type diffused layer 306AB, and all the local interconnections 309B extend over the field oxide film 302B in parallel to the word lines 305B and in the same (vectorial) direction from the local contact hole 308B. Since an upper end of the local contact hole 308B is positioned at a level higher than that of the word line 305B, the local interconnection 309B excluding a portion thereof filling the local contact hole 308B is also positioned at a level higher than that of the word line 305B.

A second level interlayer insulator film 310B is formed to cover the local interconnections 309B and the first level interlayer insulator film 307B, and a bit contact hole 311B is formed to penetrate through the second level interlayer insulator film 310B to reach to an end of each local interconnection 309B positioned on the field oxide film 302B. Each bit contact hole 311B is filled with a contact plug 312B which is connected directly to the local interconnection 309B. A number of bit lines 313B are formed on a surface of the second level interlayer insulator film 310B in such a manner that each of the bit lines 313B is connected directly to corresponding contact plugs 312B at an upper end of the bit contact holes 311B, so that the bit line 313B is electrically connected through the local interconnections 309B to corresponding N-type diffused layers 306AB. The bit lines 313B are formed at a level higher than that of the word lines 305B and the local interconnections 309B, and extend along the device formation region arrays and are located with a pitch of 2 F in a word line direction.

A third level interlayer insulator film 314B is formed to cover the bit lines 313B and the second level interlayer insulator film 310B, and a capacitor contact hole 315B is formed to penetrate through the third, second and first level interlayer insulator films 314B, 310B and 307B to reach to one N-type diffused layer 306BB. Each capacitor contact hole 315B is filled with a contact plug 316B which is connected directly to the N-type diffused layers 306BB. A storage node electrode 317B (constituting a capacitor lower plate) is formed on the third level interlayer insulator film 314B, in alignment with a corresponding capacitor contact hole 315B so that the storage node electrode 317B is connected to a corresponding contact plug 316B at an upper end of the capacitor contact hole 315B, and therefore, is electrically connected to a corresponding N-type diffused layers 306BB. Since an upper end of the capacitor contact hole 315B is positioned at a level higher than that of the bit line 313B, the storage node electrode 317B is also positioned at a level higher than those of the word line 305B and the bit line 313B.

In this fourth embodiment of the DRAM as mentioned above, the storage node electrode 317B is rectangular in a plan view projected onto the principal surface of the P-type silicon substrate 301B, and a long side of the storage node electrode 317B in the plan view extends in parallel to the bit lines 313B to reach from a position above the N-type diffused layer 306BB to a position above the word line 305B which extends over the same rectangular device formation regions 303B.

A storage capacitor 322B (in FIG. 15) is formed of the storage node electrode 317B, a capacitor dielectric film (insulator film) 318B covering a surface of the storage node electrode 317B, and a cell plate 319B covering the capacitor dielectric film 318B and constituting a capacitor upper plate.

As seen from the above, in the fourth embodiment of the DRAM, the rectangular device formation regions 303B are located in such a manner that two adjacent rectangular device formation regions 303B included in two different but adjacent rectangular device formation region arrays (extending along the long side of each rectangular device formation region 303B), respectively, are staggered alternately by one third (2 F) of a pitch (6 F) of the rectangular device formation region in a bit line direction along the long side of each rectangular device formation region 303B, and the local interconnection 309B connected between each N-type diffused layer 306AB and the corresponding bit line 313B is provided. With this arrangement, not only the bit line direction pitch of the rectangular device formation regions 303B can be made to 6 F, but also the word line direction pitch of the rectangular device formation regions 303B can be made to 2 F, so that the cell size of the open-bit-line type COB structure memory cells can be easily made to 6 $F^2$, similarly to the first to third embodiments.

In the fourth embodiment of the DRAM, the memory cells each composed of one transistor 321B and one associated capacitor 322B can be located in the following fashion. Assuming that "n" and "m" are natural number, when memory cells connected to the bit line at an (n)th address belong to word lines at a (3m−2)th address and at a (3m−1)th address, if memory cells connected to the bit line at an (n+1)th address belong to word lines at a (3m−1)th address and at a (3m)th address, memory cells connected to the bit line at an (n−1)th address belong to word lines at a (3m−1)th address and at a (3m)th address.

Fifth Embodiment

Figure 16B:
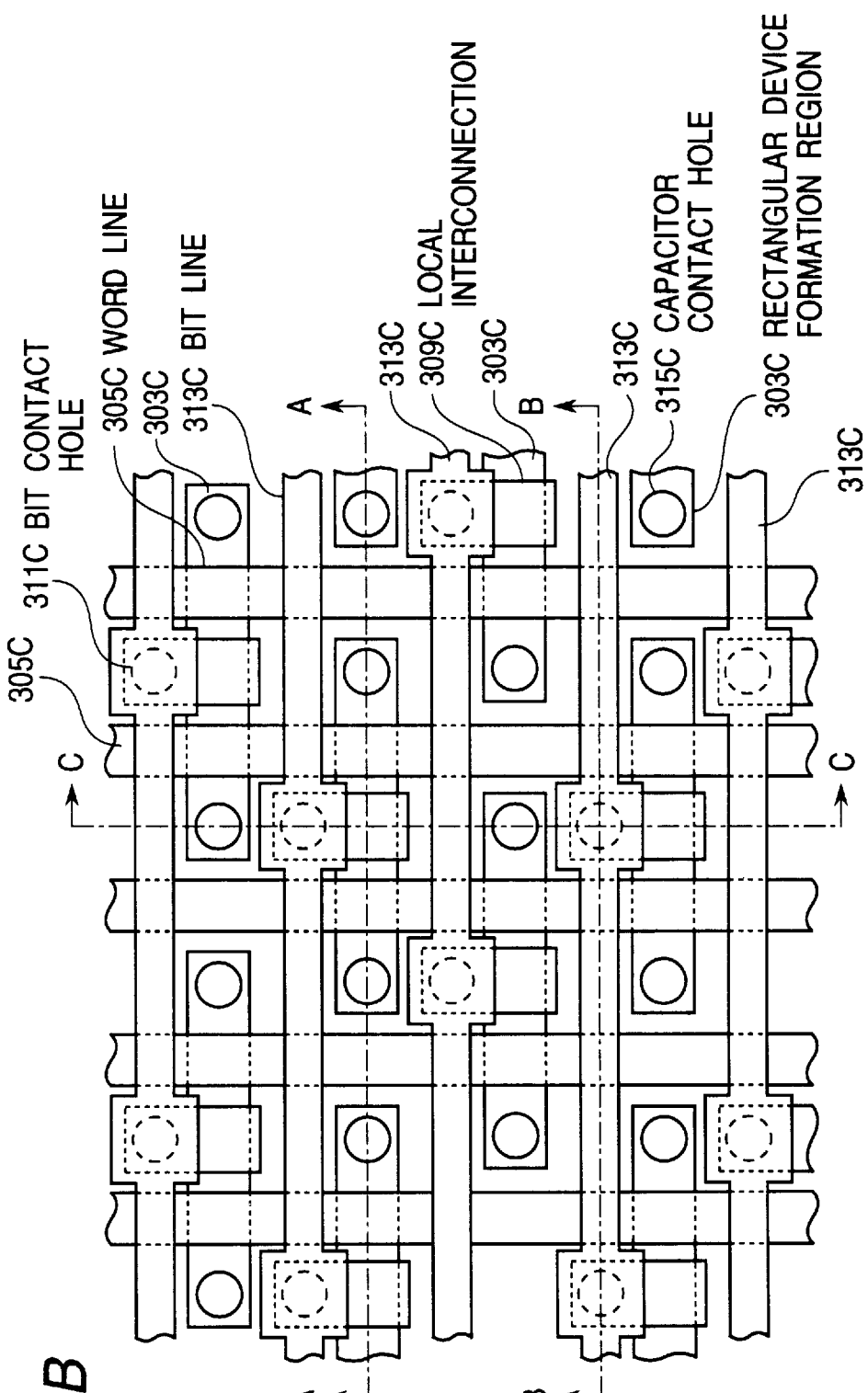
Figure 17A:
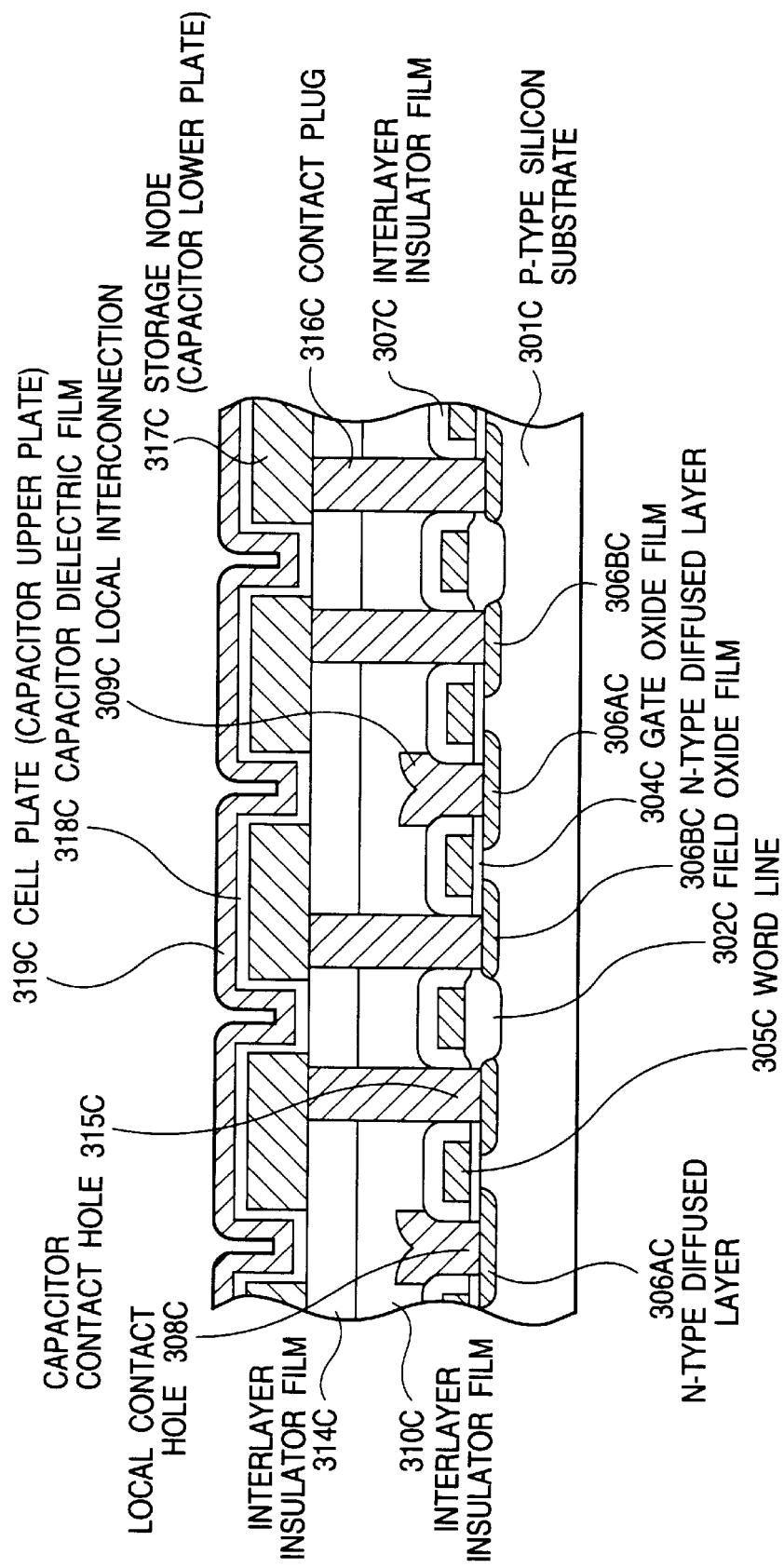
FIGS. 17A, 17B and 17C are sectional views taken along the line A—A, along the line B—B, and along the line C—C in FIGS. 16A, 16B and 16C, respectively.
Figure 17B:
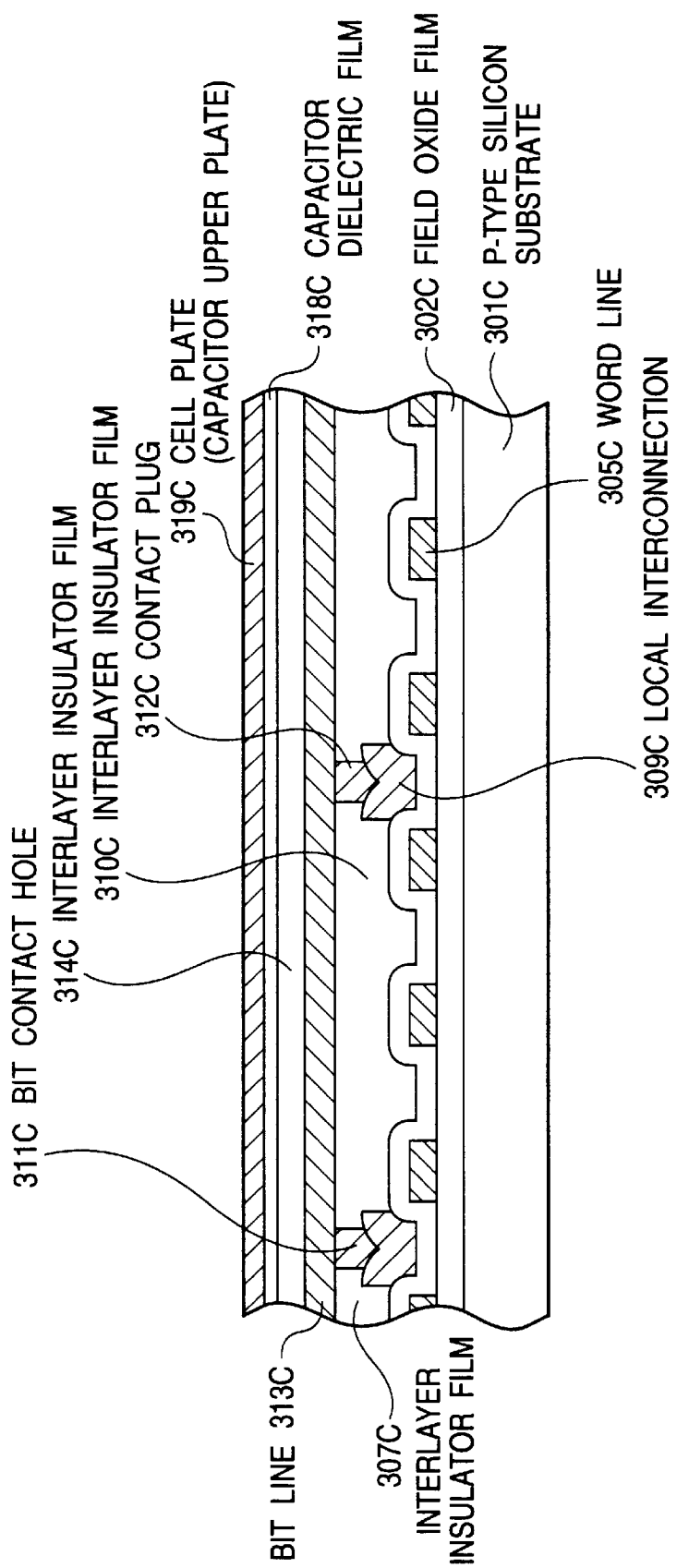
Figure 17C:
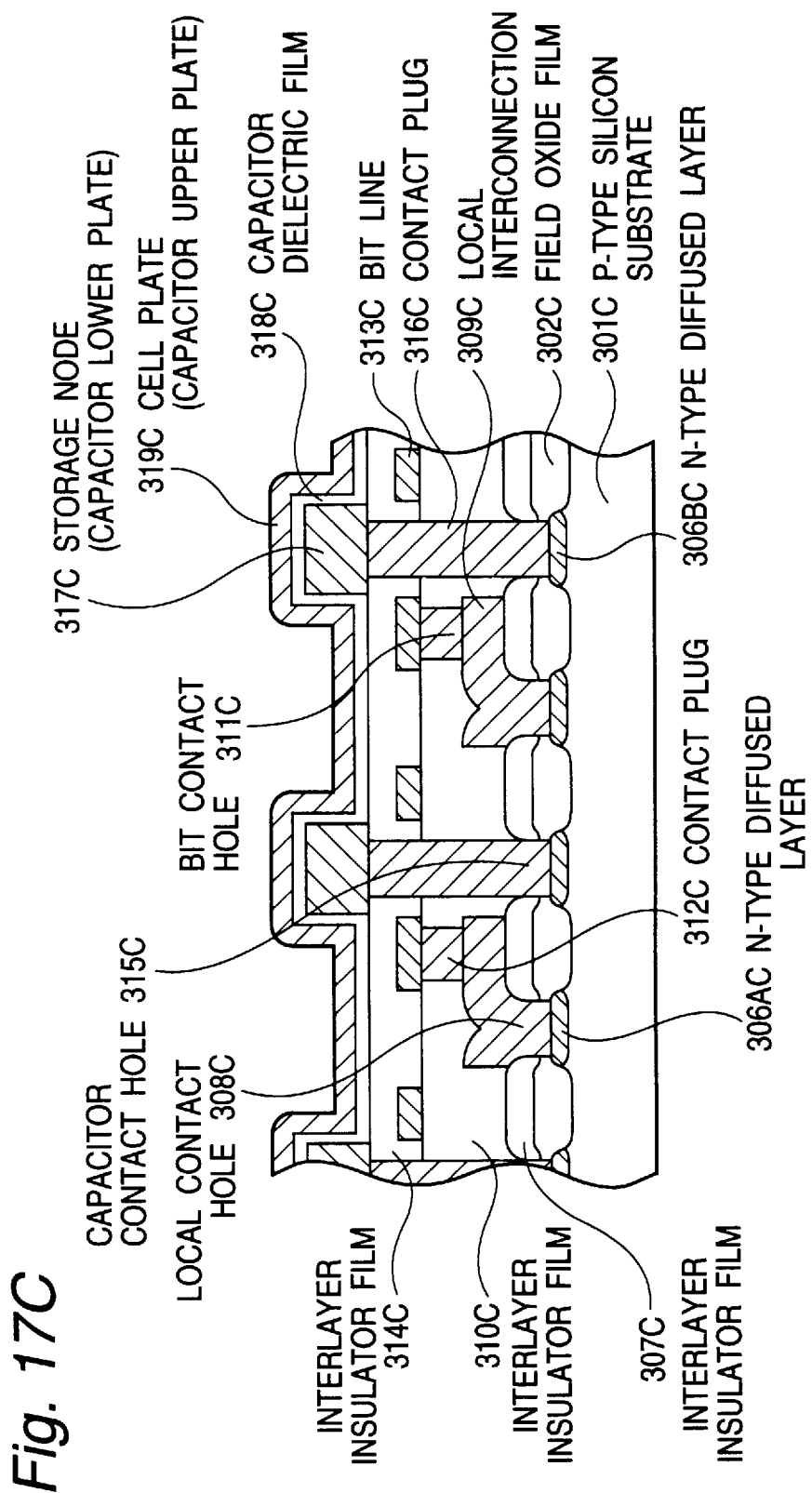
Figure 18:
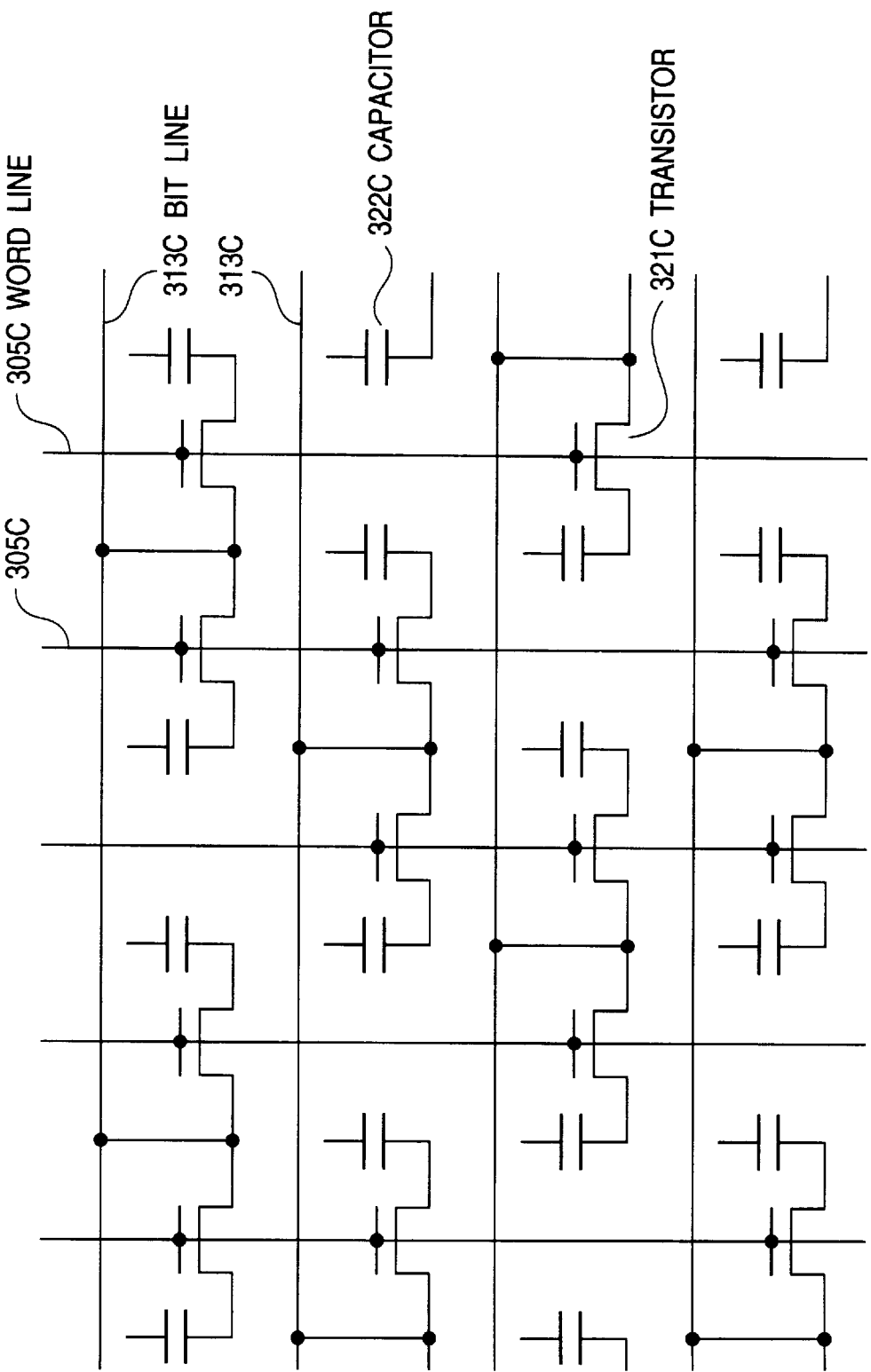
FIG. 18 is a circuit diagram of the fifth embodiment of the DRAM in accordance with the present invention shown in FIGS. 16A, 16B and 16C and FIGS. 17A, 17B and 17C.

Now, a fifth embodiment of the DRAM in accordance with the present invention will be described with reference to FIGS. 16A, 16B and 16C, FIGS. 17A, 17B and 17C, and FIG. 18. FIGS. 16A, 16B and 16C are layout diagrams at different levels, for illustrating the positional relations between various constituents of the fifth embodiment of the DRAM in accordance with the present invention, and FIG. 16A illustrates a positional relation between a device formation region, a word line and a local interconnection. FIG. 16B illustrates a positional relation between the word line, the local interconnection and a bit line, and FIG. 16C illustrates a positional relation between the bit line and a capacitor storage node (capacitor lower plate). FIGS. 17A, 17B and 17C are sectional views taken along the line A—A, along the line B—B, and along the line C—C in FIGS. 16A, 16B and 16C, respectively. FIG. 18 is a circuit diagram of the fifth embodiment of the DRAM in accordance with the present invention shown in FIGS. 16A, 16B and 16C and FIGS. 17A, 17B and 17C.

A field oxide film 302C is formed in a device isolation region on a principal surface of a P-type silicon substrate 301C, so that a number of rectangular device formation regions 303C confined by the field oxide film 302C are formed on the principal surface of the P-type silicon substrate 301C. The rectangular device formation regions 303C are arranged to form a plurality of rectangular device formation region arrays extending along a long side of each rectangular device formation region 303C, and two adjacent rectangular device formation regions 303C included in two different but adjacent rectangular device formation region arrays, respectively, are staggered in an irregular direction, namely, in an at-random direction (namely, either in order nor alternately) by one third (2 F) of a pitch (6 F) of the rectangular device formation region in a bit line direction along the long side of each rectangular device formation region 303C. In the embodiment shown in FIG. 16A, the rectangular device formation regions 303C included in a rectangular device formation region array just below an uppermost rectangular device formation region array are staggered from the rectangular device formation regions 303C included in the uppermost rectangular device formation region array, in a left-hand direction in the drawing by one third (2 F) of the pitch (6 F) of the rectangular device formation region, but, the rectangular device formation regions 303C included in a lowermost rectangular device formation region array are staggered from the rectangular device formation regions 303C included in a rectangular device formation region array just above the lowermost rectangular device formation region array, in a right-hand direction in the drawing by one third (2 F) of the pitch (6 F) of the rectangular device formation region. In each rectangular device formation region 303C, two transistors 321C (in FIG. 18) are formed. A pitch of the device formation region arrays is 2 F in a word line direction orthogonal to the long side of each rectangular device formation region 303C.

In each rectangular device formation region 303C, a gate oxide film 304C is formed on the principal surface of the P-type silicon substrate 301C, and two word lines 305C each acting as a gate electrode are formed to extend on the gate oxide film 304C, to extend orthgonally to the long side of each rectangular device formation region 303C. The word lines 305C are located with a pitch of 2 F in the bit line direction. In addition, in each rectangular device formation region 303C, one N-type diffused layer 306AC and two N-type diffused layers 306BC are formed in self alignment with the word lines 305C and the field oxide film 302C. Each one transistor 321C (in FIG. 18) is constituted of the P-type silicon substrate 301C, the gate oxide film 304C, one word line 305C, the common N-type diffused layer 306AC and one of the two N-type diffused layers 306BC formed in each rectangular device formation region 303C.

A first level interlayer insulator film 307C is formed to cover each transistor 321C and the field oxide film 302C, and a local contact hole 308C is formed to penetrate through the interlayer insulator film 307C to reach to each N-type diffused layer 306AC. A local interconnection 309C is connected directly through the local contact hole 308C to the N-type diffused layer 306AC, and all the local interconnections 309C extend over the field oxide film 302C in parallel to the word lines 305C and in the same (vectorial) direction from the local contact hole 308C. Since an upper end of the local contact hole 308C is positioned at a level higher than that of the word line 305C, the local interconnection 309C excluding a portion thereof filling the local contact hole 308C is also positioned at a level higher than that of the word line 305C.

A second level interlayer insulator film 310C is formed to cover the local interconnections 309C and the first level interlayer insulator film 307C, and a bit contact hole 311C is formed to penetrate through the second level interlayer insulator film 310C to reach to an end of each local interconnection 309C positioned on the field oxide film 302C. Each bit contact hole 311C is filled with a contact plug 312C which is connected directly to the local interconnection 309C. A number of bit lines 313C are formed on a surface of the second level interlayer insulator film 310C in such a manner that each of the bit lines 313C is connected directly to corresponding contact plugs 312C at an upper end of the bit contact holes 311C, so that the bit line 313C is electrically connected through the local interconnections 309C to corresponding N-type diffused layers 306AC. The bit lines 313C are formed at a level higher than that of the word lines 305C and the local interconnections 309C, and extend along the device formation region arrays and are located with a pitch of 2 F in a word line direction.

A third level interlayer insulator film 314C is formed to cover the bit lines 313C and the second level interlayer insulator film 310C, and a capacitor contact hole 315C is formed to penetrate through the third, second and first level interlayer insulator films 314C, 310C and 307C to reach to one N-type diffused layer 306BC. Each capacitor contact hole 315C is filled with a contact plug 316C which is connected directly to the N-type diffused layers 306BC. A storage node electrode 317C (constituting a capacitor lower plate) is formed on the third level interlayer insulator film 314C, in alignment with a corresponding capacitor contact hole 315C so that the storage node electrode 317C is connected to a corresponding contact plug 316C at an upper end of the capacitor contact hole 315C, and therefore, is electrically connected to a corresponding N-type diffused layers 306BC. Since an upper end of the capacitor contact hole 315C is positioned at a level higher than that of the bit line 313C, the storage node electrode 317C is also positioned at a level higher than those of the word line 305C and the bit line 313C.

In this third embodiment of the DRAM as mentioned above, the storage node electrode 317C is rectangular in a plan view projected onto the principal surface of the P-type silicon substrate 301C, and a long side of the storage node electrode 317C in the plan view extends in parallel to the bit lines 313C to reach from a position above the N-type diffused layer 306BC to a position above the word line 305C which extends over the same rectangular device formation regions 303C.

A storage capacitor 322C (in FIG. 18) is formed of the storage node electrode 317C, a capacitor dielectric film (insulator film) 318C covering a surface of the storage node electrode 317C, and a cell plate 319C covering the capacitor dielectric film 318C and constituting a capacitor upper plate.

As seen from the above, in the fifth embodiment of the DRAM, the rectangular device formation regions 303C are located in such a manner that two adjacent rectangular device formation regions 303C included in two different but adjacent rectangular device formation region arrays (extending along the long side of each rectangular device formation region 303C), respectively, are staggered in a bit line direction along the long side of each rectangular device formation region 303C, at random in either of opposing directions of the bit line direction, by one third (2 F) of a pitch (6 F) of the rectangular device formation region in the bit line direction, and the local interconnection 309C connected between each N-type diffused layer 306AC and the corresponding bit line 313C is provided. With this arrangement, not only the bit line direction pitch of the rectangular device formation regions 303C can be made to 6 F, but also the word line direction pitch of the rectangular device formation regions 303C can be made to 2 F, so that the cell size of the open-bit-line type COB structure memory cells can be easily made to 6 $F^2$, similarly to the first to fourth embodiments.

In the fifth embodiment of the DRAM, the memory cells each composed of one transistor 321C and one associated capacitor 322C can be located in the following fashion. Assuming that "n" and "m" are natural number, when memory cells connected to the bit line at an (n)th address belong to word lines at a (3m−2)th address and at a (3m−1)th address, if memory cells connected to the bit line at an (n+1)th address belong to word lines at a (3m−1)th address and at a (3m)th address, memory cells connected to the bit line at an (n−1)th address belong to word lines at a (3m−1)th address and at a (3m)th address in one case, and belong to word lines at a (3m−2)th address and at a (3m)th address in the other case.

As seen from the above, the open-bit-line type COB structure DRAM in accordance with the present invention is characterized in that a number of rectangular device formation regions in each of which two transistors are formed are located to form a plurality of rectangular device formation region arrays, in such a manner that two adjacent rectangular device formation regions included in two different but adjacent rectangular device formation region arrays (extending along the long side of each rectangular device formation region), respectively, are staggered in a bit line direction along the long side of each rectangular device formation region by one third (2 F) of a pitch (6 F) of the rectangular device formation region in the bit line direction, and the local interconnection connected to one of a pair of source/drain diffused layers of each of the transistors formed in each rectangular device formation region, is provided in parallel to the word line. With this arrangement, not only the bit line direction pitch of the rectangular device formation regions can be made to 6 F, but also the word line direction pitch of the rectangular device formation regions can be made to 2 F, so that the cell size of the open-bit-line type COB structure memory cells can be easily made to 6 $F^2$.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory of the type including a number of memory cells each of which is composed of a transistor formed at a principal surface of a semiconductor substrate, a bit line formed at a level higher than that of said transistor, and a capacitor composed of a capacitor lower electrode, a capacitor dielectric film and a capacitor upper electrode which are formed at a level higher than that of said bit line; the semiconductor memory comprising:

a plurality of rectangular device formation regions confined in said principal surface of said semiconductor substrate by a device isolation film formed on said principal surface of said semiconductor substrate, separated from each other with a predetermined spacing, said rectangular device formation regions being located to form a plurality of rectangular device formation region arrays along a long side of said rectangular device formation regions, two adjacent rectangular device formation regions included in two different adjacent rectangular device formation region arrays, respectively, being staggered in a bit line direction along the long side of each rectangular device formation region by one third of a pitch of said rectangular device formation regions in the bit line direction;

two transistors formed in each of said rectangular device formation regions, said two transistors including two word lines formed on a gate oxide film formed on said principal surface of said semiconductor substrate within said rectangular device formation region, to extend orthogonally to the long side of each rectangular device formation region, a first diffused layer formed in a surface region of said semiconductor substrate between said two word lines within said rectangular device formation region, and two second diffused layers formed in the surface region of said semiconductor substrate between said device isolation film and said two word lines within said rectangular device formation region, so that each of said two transistors is formed of one of said two word lines, said first diffused layer, and one adjacent to said one of said two word lines, of said two second diffused layers;

a plurality of bit lines formed at a level higher than that of said word lines, insulated from said word lines, each of said bit lines extending in a direction orthogonal to said word lines, along a corresponding rectangular device formation region array, and being connected through a bit contact hole to said first diffused layer of said rectangular device formation regions included in said corresponding rectangular device formation region array;

two local interconnections provided for each one of said rectangular device formation regions, said local interconnections being connected through local contact holes to said second diffused layers formed in said rectangular device formation region, respectively, said local interconnections extending in parallel to said word lines and in an opposite direction to each other, to reach a position above said device isolation film; and a capacitor lower electrode formed at a level higher than that of said bit lines, insulated from said bit lines, for each one of said transistors, said capacitor lower electrode being connected through a capacitor contact hole formed between adjacent bit lines, to one end positioned above said device isolation film, of a corresponding local interconnection, said capacitor lower electrode being covered with a capacitor dielectric film which is also covered with a capacitor upper electrode, so that one storage capacitor is constituted of said capacitor lower electrode, said capacitor dielectric film and said capacitor upper electrode.

2. A semiconductor memory claimed in claim 1 wherein said capacitor lower electrode is rectangular in a plan view shape projected onto said principal surface of said semiconductor substrate, and a long side of said rectangular plan view shape is in parallel to said word lines.

3. A semiconductor memory claimed in claim 1 wherein said capacitor lower electrode is rectangular in a plan view shape projected onto said principal surface of said semiconductor substrate, and a long side of said rectangular plan view shape is in parallel to said bit lines.

4. A semiconductor memory of the type including a number of memory cells each of which is composed of a transistor formed at a principal surface of a semiconductor substrate, a bit line formed at a level higher than that of said transistor, and a capacitor composed of a capacitor lower electrode, a capacitor dielectric film and a capacitor upper electrode which are formed at a level higher than that of said bit line; the semiconductor memory comprising:

a plurality of rectangular device formation regions confined in said principal surface of said semiconductor substrate by a device isolation film formed on said principal surface of said semiconductor substrate, separated from each other with a predetermined spacing, said rectangular device formation regions being located to form a plurality of rectangular device formation region arrays along a long side of said rectangular device formation regions, two adjacent rectangular device formation regions included in two different adjacent rectangular device formation region arrays, respectively, being staggered in a bit line direction along the long side of each rectangular device formation region by one third of a pitch of said rectangular device formation regions in the bit line direction;

two transistors formed in each of said rectangular device formation regions, said two transistors including two word lines formed on a gate oxide film formed on said principal surface of said semiconductor substrate within said rectangular device formation region, to extend orthogonally to the long side of each rectangular device formation region, a first diffused layer formed in a surface region of said semiconductor substrate between said two word lines within said rectangular device formation region, and two second diffused layers formed in the surface region of said semiconductor substrate between said device isolation film and said two word lines within said rectangular device formation region, so that each of said two transistors is formed of one of said two word lines, said first diffused layer and one of said second diffused layers adjacent to said one of said two word lines;

a local interconnection provided for each one of said rectangular device formation regions, said local interconnection being connected through local contact holes to said first diffused layer formed in said rectangular device formation region, and said local interconnection extending in a predetermined direction in parallel to said word lines to reach a position above said device isolation film; and a plurality of bit lines formed at a level higher than that of said word lines, insulated from said word lines, each of said bit lines extending in a direction orthogonal to said word lines, in parallel to and between adjacent rectangular device formation region arrays, and each of said bit lines being connected through a bit contact hole to an end positioned above said device isolation film, of said local interconnection; and a capacitor lower electrode formed at a level higher than that of said bit lines, insulated from said bit lines, for each one of said transistors, said capacitor lower electrode being connected through a capacitor contact hole to a corresponding one of said two second diffused regions, said capacitor lower electrode being covered with a capacitor dielectric film which is also covered with a capacitor upper electrode, so that one storage capacitor is constituted of said capacitor lower electrode, said capacitor dielectric film and said capacitor upper electrode.

5. A semiconductor memory claimed in claim 4 wherein said two adjacent rectangular device formation regions included in said two different adjacent rectangular device formation region arrays, respectively, are staggered in order in the bit line direction along the long side of each rectangular device formation region by one third of the pitch of said rectangular device formation region in the bit line direction.

6. A semiconductor memory claimed in claim 4 wherein said two adjacent rectangular device formation regions included in said two different adjacent rectangular device formation region arrays, respectively, are staggered alternately in the bit line direction along the long side of each rectangular device formation region by one third of the pitch of said rectangular device formation region in the bit line direction.

7. A semiconductor memory claimed in claim 4 wherein said capacitor lower electrode is rectangular in a plan view shape projected onto said principal surface of said semiconductor substrate, and a long side of said rectangular plan view shape is in parallel to said word lines.

8. A semiconductor memory claimed in claim 4 wherein said capacitor lower electrode is rectangular in a plan view shape projected onto said principal surface of said semiconductor substrate, and a long side of said rectangular plan view shape is in parallel to said bit lines.

* * * * *